United States Patent
Han et al.

(10) Patent No.: US 11,990,563 B2
(45) Date of Patent: May 21, 2024

(54) NANOROD LIGHT EMITTING DEVICE, METHOD OF MANUFACTURING THE SAME, AND DISPLAY APPARATUS INCLUDING THE SAME

(71) Applicant: SAMSUNG ELECTRONICS CO., LTD., Suwon-si (KR)

(72) Inventors: Joohun Han, Hwaseong-si (KR); Junhee Choi, Seongnam-si (KR); Nakhyun Kim, Yongin-si (KR); Dongho Kim, Seoul (KR); Jinjoo Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 500 days.

(21) Appl. No.: 17/197,326

(22) Filed: Mar. 10, 2021

(65) Prior Publication Data
US 2022/0140183 A1 May 5, 2022

(30) Foreign Application Priority Data
Nov. 3, 2020 (KR) ........................ 10-2020-0145533

(51) Int. Cl.
*H01L 33/08* (2010.01)
*H01L 27/15* (2006.01)
(Continued)

(52) U.S. Cl.
CPC .......... *H01L 33/145* (2013.01); *H01L 27/156* (2013.01); *H01L 33/0062* (2013.01); *H01L 33/0095* (2013.01); *H01L 33/30* (2013.01)

(58) Field of Classification Search
CPC ...................................................... H01L 33/08
See application file for complete search history.

(56) References Cited

U.S. PATENT DOCUMENTS 9,219,195 B2  12/2015  Kim et al.
9,252,328 B2   2/2016  Crowder et al.
(Continued)

FOREIGN PATENT DOCUMENTS

KR  10-2011-0040676 A   4/2011
KR  10-2012-0122160 A  11/2012
KR  10-2020-0088947 A   7/2020

OTHER PUBLICATIONS

Reza Abdolvand et al., "A Gap Reduction and Manufacturing Technique for Thick Oxide Mask Layers With Multiple-Size Sub-μm Openings", Journal of Microelectromechanical Systems, vol. 15, No. 5, IEEE, Oct. 2006, pp. 1139-1144, 6 pages total.
(Continued)

*Primary Examiner* — Moazzam Hossain
*Assistant Examiner* — Hajar Kolahdouzan
(74) *Attorney, Agent, or Firm* — Sughrue Mion, PLLC

(57) ABSTRACT

A nanorod light emitting device, a method of manufacturing the same, and a display apparatus including the nanorod light emitting device are provided. The nanorod light emitting device includes a first semiconductor layer doped with a first conductivity type, a light emitting layer disposed on the first semiconductor layer, and a second semiconductor layer disposed on the light emitting layer and doped with a second conductivity type that is electrically opposite to the first conductivity type, wherein a distance between a lower surface of the first semiconductor layer and an upper surface of the second semiconductor layer is in a range of about 2 μm to about 10 μm, wherein a difference between a diameter of the upper surface of the second semiconductor layer and the lower surface of the first semiconductor layer is 10% or less of a diameter of the upper surface of the second semiconductor layer.

13 Claims, 38 Drawing Sheets

(51) Int. Cl.
   *H01L 33/00*    (2010.01)
   *H01L 33/14*    (2010.01)
   *H01L 33/30*    (2010.01)

(56) References Cited

U.S. PATENT DOCUMENTS

| | | | |
|---|---|---|---|
| 2011/0263054 A1* | 10/2011 | Yu | H01L 33/145 |
| | | | 438/34 |
| 2015/0118604 A1 | 4/2015 | Dynes et al. | |
| 2015/0187991 A1* | 7/2015 | McGroddy | H01L 24/95 |
| | | | 257/13 |
| 2017/0062683 A1* | 3/2017 | Chen | H01L 33/145 |
| 2017/0170360 A1* | 6/2017 | Bour | H01L 33/145 |
| 2022/0069161 A1 | 3/2022 | Park et al. | |

OTHER PUBLICATIONS

Wei Guo et al., "Review of profile and roughening simulation in microelectronics plasma etching", Journal of Physics D: Applied Physics, 42, doi:10.1088/0022-3727/42/19/194014, filed Sep. 18, 2009, 18 pages total.

Zhuang, et al., "Fabrication and Characterization of Light-Emitting Diodes Comprising Highly Ordered Arrays of Emissive InGaN/GaN Nanorods", vol. 25, No. 11, May 2013, IEEE Photonics Technology Letters, XP 011510543, 3 pages total (p. 1047-1049).

Shields, et al., "Fabrication and properties of etched GaN nanorods", 2012, Physica Status Solidi, XP 055839763, 4 pages total, vol. 3, No. 3-4 Nov. 2011 (p. 631-634).

Communication dated Sep. 23, 2021 by the European Patent Office in European Patent Application No. 21163683.2.

\* cited by examiner

NANOROD LIGHT EMITTING DEVICE, METHOD OF MANUFACTURING THE SAME, AND DISPLAY APPARATUS INCLUDING THE SAME

CROSS-REFERENCE TO RELATED APPLICATION

This application is based on and claims priority under 35 U.S.C. § 119 to Korean Patent Application No. 10-2020-0145533, filed on Nov. 3, 2020, in the Korean Intellectual Property Office, the disclosure of which is incorporated by reference herein in its entirety.

BACKGROUND

1. Field

The disclosed embodiments relate to a light emitting device and a method of manufacturing the same, and more particularly, to a nanorod light emitting device having a micro-sized nano-scale and a method of manufacturing the same. Further, the disclosed embodiments relate to a display apparatus including a nanorod light emitting device.

2. Description of Related Art

A light emitting diode (LED) is known as a next-generation light source having advantages such as a long lifespan, low power consumption, fast response speeds, and environmental friendliness, compared to conventional light sources. Because of these advantages, industrial demand for LEDs is increasing. LEDs are generally applied and used in various products such as lighting devices and backlights of display apparatuses. Recently, micro-units or nano-units of micro-LEDs using Group II-VI or Group III-V compound semiconductors have been developed. In addition, micro-LED displays in which such micro-LEDs are directly applied as light emitting elements of display pixels are being developed.

SUMMARY

One or more example embodiments provide a nanorod light emitting device having a nano-scale ultra-small size and a method of manufacturing the same.

Further, one or more example embodiments provide a display apparatus including a nanorod light emitting device.

According to an aspect of an example embodiment, there is provided a nanorod light emitting device including: a first semiconductor layer doped with a first conductivity type, and comprising a first lower surface and a first upper surface that oppose each other; a second semiconductor layer doped with a second conductivity type that is electrically opposite to the first conductivity type, and comprising a second lower surface and a second upper surface that oppose each other; and a light emitting layer disposed between the first upper lower surface of the first semiconductor layer and the second lower surface of the second semiconductor layer, wherein a distance between the first lower surface of the first semiconductor layer and the second upper surface of the second semiconductor layer may be in a range of 2 µm to 10 µm, wherein a difference between a second diameter of the second upper surface of the second semiconductor layer and a first diameter of the first lower surface of the first semiconductor layer may be 10% or less of the second diameter of the second upper surface of the second semiconductor layer.

The nanorod light emitting device may further include a ring-shaped groove formed in a side surface of the second semiconductor layer, wherein a third diameter of the ring-shaped groove of the second semiconductor layer is 90% to 100% of the second diameter of the second upper surface of the second semiconductor layer.

The nanorod light emitting device may further include a plurality of stripe grooves irregularly formed in a surface of the nanorod light emitting device in a direction from the second semiconductor layer toward the first semiconductor layer, wherein a depth from the surface of the nanorod light emitting device to a bottom of the stripe groove may be 10 nm or less.

The nanorod light emitting device may further include: a conductor layer disposed between a central portion of a lower surface of the light emitting layer and the first semiconductor layer or between a central portion of an upper surface of the light emitting layer and the second semiconductor layer; and a current blocking layer disposed to surround a sidewall of the conductor layer.

The current blocking layer may include an oxide material formed by oxidizing a side surface of the conductor layer.

The conductor layer may include a first conductor layer disposed between the central portion of the lower surface of the light emitting layer and the first semiconductor layer, and a second conductor layer disposed between the second semiconductor layer and the central portion of the upper surface of the light emitting layer. The current blocking layer may include a first current blocking layer disposed between the lower surface of the light emitting layer and the first semiconductor layer to surround a sidewall of the first conductor layer, and a second current blocking layer disposed between the upper surface of the light emitting layer and the second semiconductor layer to surround a sidewall of the second conductor layer.

An outer diameter of the current blocking layer may be in a range of 0.3 µm to 1 µm, and a diameter of the conductor layer is 0.05 µm or more may be less than the outer diameter of the current blocking layer.

A thickness of the current blocking layer may be equal to a thickness of the conductor layer.

The thickness of the current blocking layer may be in a range of 5 nm to 200 nm.

The conductor layer may include $Al_xGa_{1-x}As$, the current blocking layer may include a chemical compound of aluminum and oxide, and the first and the second semiconductor layers may include AlGaInP, wherein x is greater than 0.85.

The nanorod light emitting device may further include a passivation layer disposed to surround side surfaces of the first semiconductor layer, the current blocking layer, the light emitting layer, and the second semiconductor layer.

The passivation layer may include at least one material selected from $AlO_x$, $HfO_x$, $SiN_x$, $SiO_x$, and $Al_xGa_{1-x}As$, and wherein x is greater than 0.9.

The nanorod light emitting device may further include an insulating film disposed to surround side surfaces of the second semiconductor layer, the light emitting layer, and the current blocking layer and including implanted heavy ions, wherein the heavy ions may include one or more of Ar, As, Kr, and Xe.

According to an aspect of another example embodiment, there is provided a display apparatus including: a plurality of pixel electrodes; a common electrode corresponding to the plurality of pixel electrodes; and a plurality of nanorod light emitting devices connected between each of the plurality of pixel electrodes and the common electrode, wherein each of the plurality of nanorod light emitting devices may include: a first semiconductor layer doped with a first conductivity type, and comprising a first lower surface and a first upper surface that oppose each other; a second semiconductor layer doped with a second conductivity type that is electrically opposite to the first conductivity type, and comprising a second lower surface and a second upper surface that oppose each other; and a light emitting layer disposed between the first upper lower surface of the first semiconductor layer and the second lower surface of the second semiconductor layer, wherein a distance between the first lower surface of the first semiconductor layer and the first upper surface of the second semiconductor layer may be in a range of 2 μm to 10 μm, and wherein a difference between a second diameter of the second upper surface of the second semiconductor layer and a first diameter of the first lower surface of the first semiconductor layer may be 10% or less of the second diameter of the second upper surface of the second semiconductor layer.

According to an aspect of an example embodiment, there is provided a method of manufacturing a plurality of nanorod light emitting devices, the method including: sequentially stacking a first semiconductor layer doped with a first conductivity type, on a semiconductor substrate, a light emitting layer on the first semiconductor layer, a second semiconductor layer doped with a second conductivity type that is electrically opposite to the first conductivity type, on the second semiconductor layer, a first hard mask layer on the second semiconductor layer, and a second hard mask layer on the first hard mask layer; forming a photoresist layer on the second hard mask layer and patterning the photoresist layer to expose a second portion of the second hard mask layer; etching the exposed second portion of the second hard mask layer to expose a first portion of the first hard mask layer; forming a first hard mask by dry-etching the exposed first portion of the first hard mask layer; and forming the plurality of nanorod light emitting devices by partially dry-etching the second semiconductor layer, the light emitting layer, and the first semiconductor layer using the first hard mask, wherein each of the first hard masks may be formed to have an inclined side surface, and an inclination angle of the inclined side surface with respect to a base of the first hard mask may be 80 degrees or less.

The first hard mask may be formed with a thickness that allows a ratio of a thickness from the first semiconductor layer to the second semiconductor layer to the thickness of first hard mask to be in a range from 5:1 to 10:1.

The second hard mask layer may be formed with a thickness that allows a ratio of a thickness of the first hard mask to the thickness of the second hard mask layer to be in a range from 5:1 to 8:1.

The first semiconductor layer may include a first lower surface and a first upper surface that oppose each other, and the second semiconductor layer may include a second lower surface and a second upper surface that oppose each other, wherein a distance between the first lower surface of the first semiconductor layer and the second upper surface of the second semiconductor layer may be in a range of 2 μm to 10 μm. In each of the plurality of nanorod light emitting devices, a difference between a second diameter of the second upper surface of the second semiconductor layer and a first diameter of the first lower surface of the first semiconductor layer may be 10% or less of the second diameter of the second upper surface of the second semiconductor layer.

The first semiconductor layer may include a first lower surface and a first upper surface that oppose each other, and the second semiconductor layer may include a second lower surface and a second upper surface that oppose each other. Each of the plurality of nanorod light emitting devices may include a ring-shaped groove formed in a side surface of the second semiconductor layer. A third diameter of the ring-shaped groove of the second semiconductor layer may be 90% to 100% of a second diameter of the second upper surface of the second semiconductor layer.

Each of the plurality of nanorod light emitting devices may include a plurality of stripe grooves irregularly formed in a surface of the nanorod light emitting device in a direction from the second semiconductor layer toward the first semiconductor layer. A depth from the surface of each of the plurality of nanorod light emitting devices to a bottom of the stripe groove may be 10 nm or less.

The forming of the first hard mask may include partially etching a portion of the second semiconductor layer under the first hard mask layer to a predetermined depth.

The forming of the first hard mask may further include redepositing etched material that is obtained by partially etching the portion of the second semiconductor layer, on the inclined side surface of the first hard mask.

The forming of the first hard mask may be performed by supplying argon (Ar) gas to a chamber at a flow rate of 5 sccm to 20 sccm while maintaining a pressure inside the chamber at 5 mTorr to 20 mTorr.

The method may further include: forming a conductor layer material on the first semiconductor layer between stacking of the first semiconductor layer and the stacking of the light emitting layer, or forming a conductor layer on the light emitting layer between the stacking of the light emitting layer and the stacking of the second semiconductor layer; and forming a current blocking layer surrounding a sidewall of the conductor layer by oxidizing the sidewall of the conductor layer through an oxidation process after partially dry-etching the second semiconductor layer, the light emitting layer, and the first semiconductor layer.

The conductor layer may include $Al_xGa_{1-x}As$, the current blocking layer may include a chemical compound of aluminum and oxide, and the first and the second semiconductor layers may include AlGaInP, wherein x is greater than 0.85.

The method may further include forming a passivation layer surrounding side surfaces of the first semiconductor layer, the current blocking layer, the light emitting layer, and the second semiconductor layer.

The passivation layer may include at least one material selected from $AlO_x$, $HfO_x$, $SiN_x$, $SiO_x$, and $Al_xGa_{1-x}As$, wherein x is greater than 0.9.

The method may include implanting ions into side surfaces of the second semiconductor layer, the light emitting layer, and the conductor layer to form an insulating film before the forming of the current blocking layer.

The method may further include separating the plurality of nanorod light emitting devices.

BRIEF DESCRIPTION OF THE DRAWINGS

The above and/or other aspects will be more apparent by describing certain example embodiments, with reference to the accompanying drawings, in which.

DETAILED DESCRIPTION

Figure 1A:
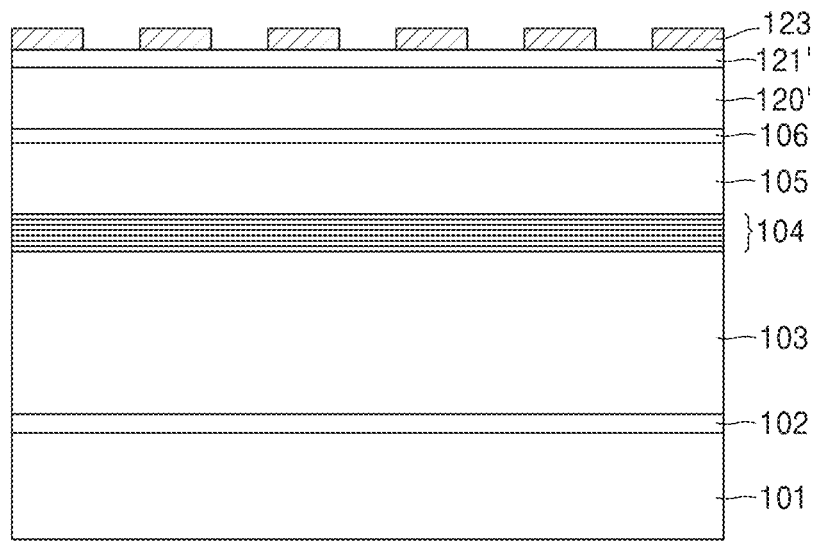
FIGS. 1A to 1D are cross-sectional views schematically illustrating a method of manufacturing a nanorod light emitting device, according to an exemplary embodiment.

A nanorod light emitting device, a manufacturing method thereof, and a display apparatus including the nanorod light emitting device according to example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

Hereinafter, what is described as "upper part" or "on" may include not only those directly above by contact, but also those above non-contact. The terms of a singular form may include plural forms unless otherwise specified. In addition, when a certain part "includes" a certain component, it means that other components may be further included rather than excluding other components unless otherwise stated.

The use of the term "the" and similar designating terms may correspond to both the singular and the plural. If there is no explicit order or contradictory statement about the steps constituting the method, these steps may be performed in an appropriate order, and are not necessarily limited to the order described.

In addition, terms such as "unit" and "module" described in the specification mean a unit that processes at least one function or operation, and this may be implemented as hardware or software, or may be implemented as a combination of hardware and software.

The connection or connection members of lines between the components shown in the drawings are illustrative of functional connections and/or physical or circuit connections, and may be represented as a variety of functional connections, physical connections, or circuit connections that are replaceable or additional in an actual device.

The use of all examples or illustrative terms is merely for describing technical ideas in detail, and the scope is not limited by these examples or illustrative terms unless limited by the claims.

FIGS. 1A to 1D are cross-sectional views schematically illustrating a method of manufacturing a nanorod light emitting device, according to an exemplary embodiment.

First, referring to FIG. 1A, a sacrificial layer 102, a first semiconductor layer 103, a light emitting layer 104, a second semiconductor layer 105, and a contact layer 106 are sequentially grown on a substrate 101. The sacrificial layer 102 is disposed over a large area of the upper surface of the substrate 101, the first semiconductor layer 103 is grown on the entire upper surface of the sacrificial layer 102, the light emitting layer 104 is grown on the entire upper surface of the first semiconductor layer 103, the second semiconductor layer 105 is grown on the upper surface of the light emitting layer 104, and the contact layer 106 is grown on the upper surface of the second semiconductor layer 105.

The substrate 101 and the sacrificial layer 102 may be made of a Group II-VI or Group III-V compound semiconductor material. The substrate 101 and the sacrificial layer 102 may be doped with the same conductivity type as the first semiconductor layer 103 thereon. For example, when the first semiconductor layer 103 is doped n-type, the substrate 101 and the sacrificial layer 102 may be formed of n-GaAs. The substrate 101 may be doped with a lower concentration than the sacrificial layer 102, and the sacrificial layer 102 may be doped with a higher concentration than the substrate 101. A contact layer may be further disposed between the sacrificial layer 102 and the first semiconductor layer 103 to provide an ohmic contact between the first semiconductor layer 103 and a metal electrode which will be disposed on a lower surface of the first semiconductor layer 103 after manufacturing the nanorod light emitting device. The contact layer disposed between the sacrificial layer 102 and the first semiconductor layer 103 may also be doped with the same conductivity type as the first semiconductor layer 103, and may be doped with a concentration higher than that of the sacrificial layer 102 and the first semiconductor layer 103.

The first semiconductor layer 103 and the second semiconductor layer 105 may be made of a Group II-VI or Group III-V compound semiconductor material. The first semiconductor layer 103 and the second semiconductor layer 105 may provide electrons and electron holes to the light emitting layer 104. For this, the first semiconductor layer 103 may be doped n-type or p-type, and the second semiconductor layer 105 may be doped with a conductivity type that is electrically opposite to that of the first semiconductor layer 103. For example, the first semiconductor layer 103 may be doped n-type and the second semiconductor layer 105 may be doped p-type, or the first semiconductor layer 103 may be doped p-type and the second semiconductor Layer 105 may be doped n-type. When the first semiconductor layer 103 or the second semiconductor layer 105 is doped n-type, for example, silicon (Si) may be used as a dopant, and when the first semiconductor layer 103 or the second semiconductor layer 105 is doped p-type, for example, Zinc (Zn) may be used as a dopant. The first semiconductor layer 103 or second semiconductor layer 105 doped n-type may provide electrons to the light emitting layer 104, and the second semiconductor layer 105 or the first semiconductor layer 103 doped p-type may provide electron holes to the light emitting layer 104.

The light emitting layer 104 has a quantum well structure in which quantum wells are disposed between barriers. Light may be generated as electrons and electron holes provided from the first and second semiconductor layers 103 and 105 recombined in the quantum well in the light emitting layer 104. The wavelength of light generated from the light emitting layer 104 may be determined according to the band gap of the material constituting the quantum well in the light emitting layer 104. The light emitting layer 104 may have only one quantum well, but may have a multi-quantum well (MQW) structure in which a plurality of quantum wells and a plurality of barriers are alternately arranged. The thickness of the light emitting layer 104 or the number of quantum wells in the light emitting layer 104 may be appropriately selected considering the driving voltage and luminous efficiency of the nanorod light emitting device to be manufactured. For example, the thickness of the light emitting layer 104 may be selected to be less than twice the outer diameter of the nanorod light emitting device to be manufactured.

The contact layer 106 may be disposed on the second semiconductor layer 105 to provide an ohmic contact. The contact layer 106 may be doped with the same conductivity type as the second semiconductor layer 105. For example, when the second semiconductor layer 105 is doped p-type, the contact layer 106 may also be doped p-type. The contact layer 106 may be formed of, for example, GaInP or GaAs. However, the contact layer 106 may be omitted if necessary in an example embodiment.

After the materials constituting the nanorod light emitting device are stacked, a plurality of nanorod light emitting devices may be manufactured by partially etching a structure in which the materials are stacked. For this, a first hard mask layer 120' and a second hard mask layer 121' may be sequentially formed on the contact layer 106. In addition, a soft mask 123 is formed on the second hard mask layer 121'. The soft mask 123 may be formed of a photoresist, and may be softer than the first hard mask layer 120' and the second hard mask layer 121'. For example, by forming a photoresist layer on the second hard mask layer 121' and patterning the photoresist layer using a lithography process, the soft mask 123 may be formed. Then, a part of the upper surface of the second hard mask layer 121' may be exposed between adjacent patterns of the soft mask 123.

The first hard mask layer 120' may be made of an oxide mask material having a high selectivity with respect to the semiconductor material of the first and second semiconductor layers 103 and 105. The thickness of the first hard mask layer 120' may be set to have a preset ratio with respect to a first thickness from the first semiconductor layer 103 to the second semiconductor layer 105 or a second thickness from the first semiconductor layer 103 to the contact layer 106. For example, the ratio of the first thickness to the thickness of the first hard mask layer 120' or the ratio of the second thickness to the thickness of the first hard mask layer 120' may be in a range from about 5:1 to about 10:1. For example, the first hard mask layer 120' may be formed with a thickness of about 200 nm to about 2 μm. In addition, the second hard mask layer 121' may be made of a metal mask material having a high selectivity with respect to the mask material of the first hard mask layer 120'. The thickness of the second hard mask layer 121' may be set to have a preset ratio with respect to the thickness of the first hard mask layer 120'. For example, the ratio of the thickness of the first hard mask layer 120' to the thickness of the second hard mask layer 121' is in a range from about 5:1 to about 8:1. For example, the second hard mask layer 121' may be formed with a thickness of about 25 nm to about 400 nm taking into consideration the selectivity with respect to the first hard mask layer 120' and the thickness of the first hard mask layer 120'. The first hard mask layer 120' may be formed with metal, oxide, or a combination of metal and oxide, to protect the second semiconductor layer 105 during etching process. For example, the first hard mask layer 120' may be made of SiO2, and the second hard mask layer 121' may be made of chromium (Cr), aluminum (Al), tungsten (W), titanium (Ti), silver (Ag), or gold (Au).

Figure 1B:
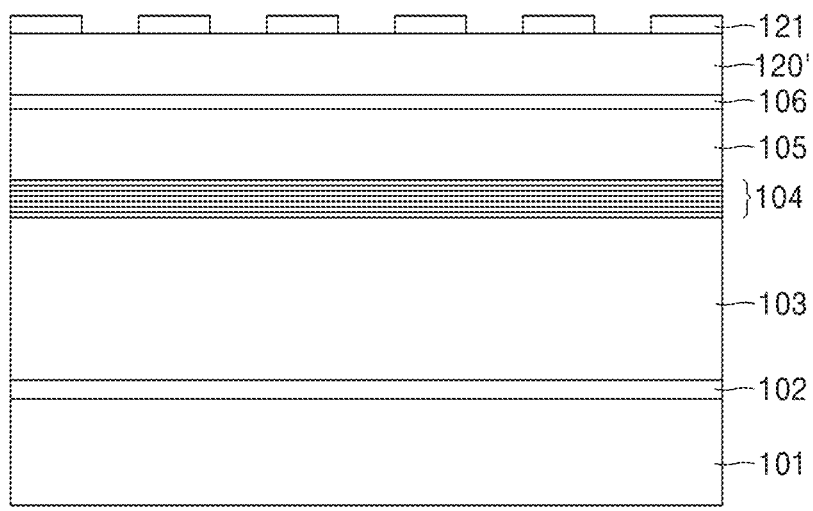

Referring to FIG. 1B, a second hard mask 121 may be formed by etching a second hard mask layer 121' exposed between adjacent patterns of the soft mask 123. The etching of the second hard mask layer 121' may be performed using, for example, a chlorine-based gas as an etchant gas, and may be performed by a dry etching method using inductive coupled plasma (ICP) equipment or reactive ion etching (RIE) equipment. The patterns of the second hard mask 121 may have a form of a two-dimensionally arranged circular dot, and a part of the first hard mask layer 120' may be exposed between adjacent patterns of the second hard mask 121.

Figure 1C:
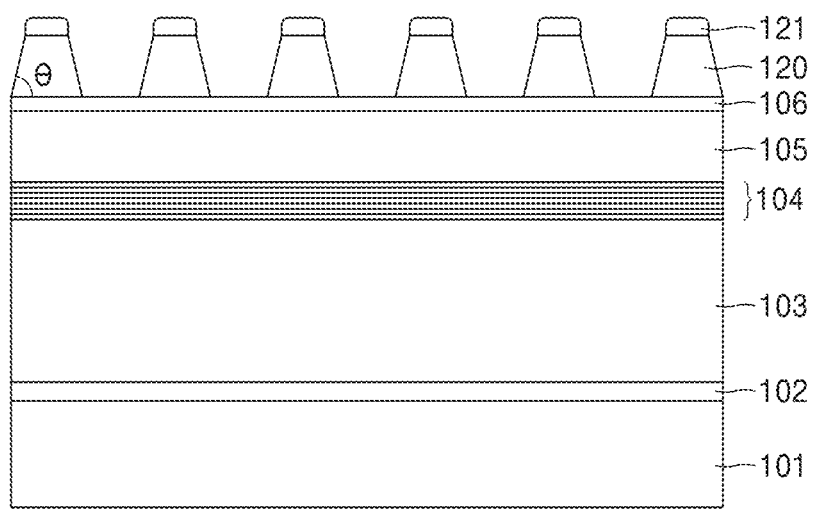

Referring to FIG. 1C, a first hard mask 120 may be formed by etching the first hard mask layer 120' exposed between adjacent patterns of the second hard mask 121. Etching of the first hard mask layer 120' may use, for example, a fluorine-based gas or argon (Ar) gas as an etching gas, and may be performed by a dry etching method using ICP equipment or RIE equipment. For example, a mixed gas of CF4 and CHF3 may be used as the etching gas, a mixed gas of CF3 and Ar may be used, or an Ar gas may be used alone. The patterns of the first hard mask 120 may have a shape of two-dimensionally arranged circular dots, and a part of the contact layer 106 may be exposed between adjacent patterns of the first hard mask 120. If the contact layer 106 is not used, the second semiconductor layer 105 may be exposed between adjacent patterns of the first hard mask 120.

The first hard mask 120 may have a truncated pyramid shape or a frustum shape. The cross-section (or the base) of the first hard mask 120 may have a trapezoidal shape or a triangular shape having an inclined side surface, as shown in FIG. 1C. The shape of the first hard mask 120 may be determined according to the material and thickness of the first hard mask layer 120', the material and thickness of the second hard mask layer 121', and etching conditions. Considering the material and thickness of the first hard mask layer 120' and the material and thickness of the second hard mask layer 121', the etching condition may be selected so that the side surface of the first hard mask 120 has an inclined shape. In particular, the etching condition may be selected so that the inclination angle θ of the side surface of the first hard mask 120 to the bottom base of the first hard mask 120 is about 80 degrees or less.

For example, when the first hard mask layer 120' is SiO2 having a thickness of about 1 µm and the second hard mask layer 121' is Al having a thickness of about 200 nm, in ICP equipment, while maintaining the pressure inside the chamber at about 10 mTorr to about 20 mTorr, CHF3 gas may be supplied to the chamber at a flow rate of about 50 sccm to about 150 sccm, and Ar gas may be supplied to the chamber at a flow rate of about 5 sccm to about 20 sccm. In addition, in RIE equipment, while maintaining the pressure inside the chamber at about 20 mTorr to about 40 mTorr, CHF3 gas is supplied to the chamber at a flow rate of about 15 sccm to about 40 sccm, and Ar gas is supplied to the chamber at a flow rate of about 2.5 sccm to about 15 sccm. Further, the power applied to the coil inside the chamber and the etching time may be adjusted so that the side surface of the first hard mask 120 has an inclined shape. For example, in ICP equipment, etching may be performed for about 3 minutes to about 4 minutes while applying about 2500 W to 3000 W with a bias of about 40 W to about 60 W to a coil. In addition, in RIE equipment, etching may be performed for about 35 minutes to about 45 minutes while applying about 150 W to about 300 W with a bias of about 1 W to about 3 W to a coil. The above-described etching conditions are merely exemplary, and if the materials and thicknesses of the first hard mask layer 120' and the second hard mask layer 121' are different, the etching conditions may also be changed.

Figure 1D:
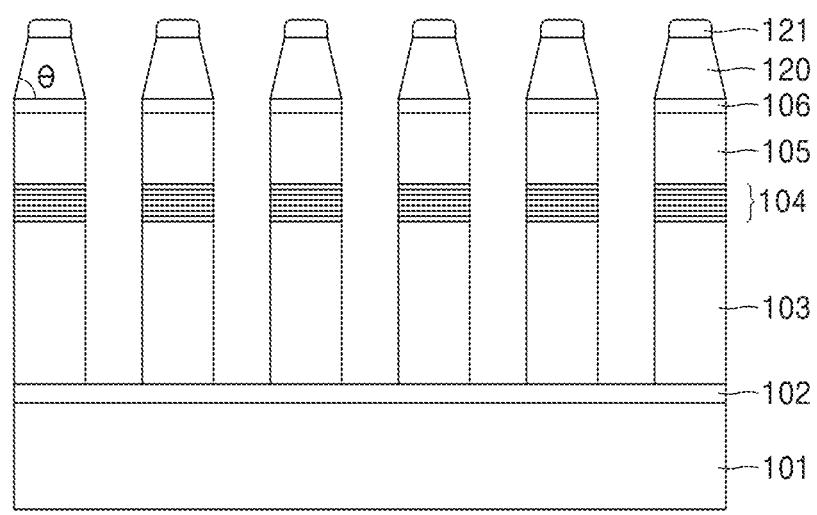

Finally, referring to FIG. 1D, by partially dry etching the contact layer 106, the second semiconductor layer 105, the light emitting layer 104, and the first semiconductor layer 103 exposed between adjacent patterns of the first hard mask 120 using the first hard mask 120 having an inclined side surface, a plurality of nanorod light emitting devices may be formed. For example, chlorine-based gas is used as an etching gas, and for the role of plasma ignition and activator, etching may be performed while supplying hydrogen (H2), nitrogen (N2), argon (Ar), or a mixed gas thereof to the chamber. Etching may be performed so that the sacrificial layer 102 is exposed.

Thereafter, the first and second hard masks 120 and 121 that remain may be removed. Then, a plurality of nanorod light emitting devices may be formed on the substrate 101 and the sacrificial layer 102 at once. Thereafter, the sacrificial layer 102 may be removed to separate the plurality of nanorod light emitting devices individually. Or, each nanorod light emitting device may be used in a state in which the substrate 101 and the sacrificial layer 102 are attached to each nanorod light emitting device by cutting the substrate 101 and the sacrificial layer 102 in the vertical direction. Or, the substrate 101 and the sacrificial layer 102 are cut in the vertical direction so that two or more nanorod light emitting devices remain, and thus, two or more nanorod light emitting devices may be used together.

Figure 2:
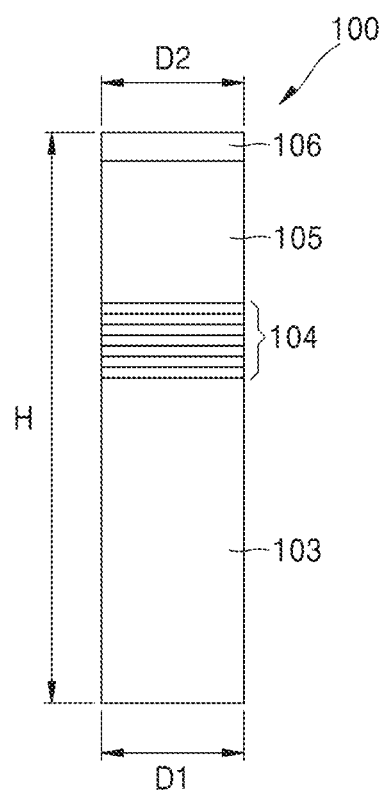
FIG. 2 is a cross-sectional view showing a schematic structure of a nanorod light emitting device according to an embodiment.

FIG. 2 is a cross-sectional view showing a schematic structure of a nanorod light emitting device according to an embodiment. Referring to FIG. 2, a nanorod light emitting device 100 may include a first semiconductor layer 103, a light emitting layer 104, a second semiconductor layer 105, and a contact layer 106. The nanorod light emitting device 100 may be manufactured using the method illustrated with reference to FIGS. 1A to 1D. In particular, the nanorod light emitting device 100 may have a relatively uniform diameter in the height direction while having a high aspect ratio that is very high in height compared to the diameter. For example, the height H of the nanorod light emitting device 100, that is, the distance between the lower surface of the first semiconducting layer 103 and the upper surface of the contact layer 106, or the distance between the lower surface of the first semiconductor layer 103 and the upper surface of the second semiconductor layer 105, may have a range of about 2 µm to about 10 µm. Further, the diameter D1 of the lower surface of the first semiconductive layer 103 and the diameter D2 of the upper surface of the second semiconductor layer 105 may range from about 0.3 µm to about 1 µm, and the difference between the diameter D2 of the upper surface of the second semiconductor layer 105 and the diameter D1 of the lower surface of the first semiconductor layer 103 may be about 10% or less of the diameter of the upper surface D2 of the second semiconductor layer 105.

This uniform diameter of the nanorod light emitting device 100 may be achieved by using the first hard mask 120 having an inclined side surface, as shown in FIG. 1C. In the comparative example in which the inclination angle of the side surface to the base of the first hard mask 120 is greater than 80 degrees, the diameter of the nanorod light emitting device increases as it goes downward in the etching process shown in FIG. 1D. In other words, according to the comparative example, the diameter of the first semiconductor layer 103 is greater than the diameter of the second semiconductor layer 105, so that the nanorod light emitting device has a truncated pyramid shape or a frustum shape. This phenomenon may be further increased when the compound semiconductor material of the first and second semiconductor layers 103 and 105 or the light emitting layer 104 includes phosphorus (P) or arsenic (As) components. For example, when the first and second semiconductor layers 103 and 105 or the light emitting layer 104 include a compound semiconductor material such as AlGaInP, AlGaAs, and the like, it may be difficult to manufacture a nanorod light emitting device having a uniform diameter. On the other hand, according to the present embodiment, after forming the side surface of the first hard mask 120 to be inclined to about 80 degrees or less using the second hard mask 121, by performing the etching process shown in FIG. 1D, a nanorod light emitting device 100 having a relatively uniform diameter may be manufactured.

Figure 3A:
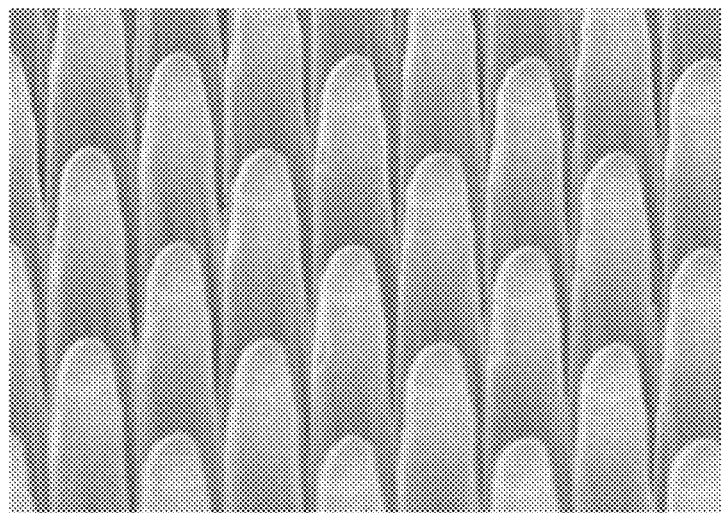
FIG. 3A is a picture showing a nanorod light emitting device manufactured by a method according to a comparative example.
Figure 3B:
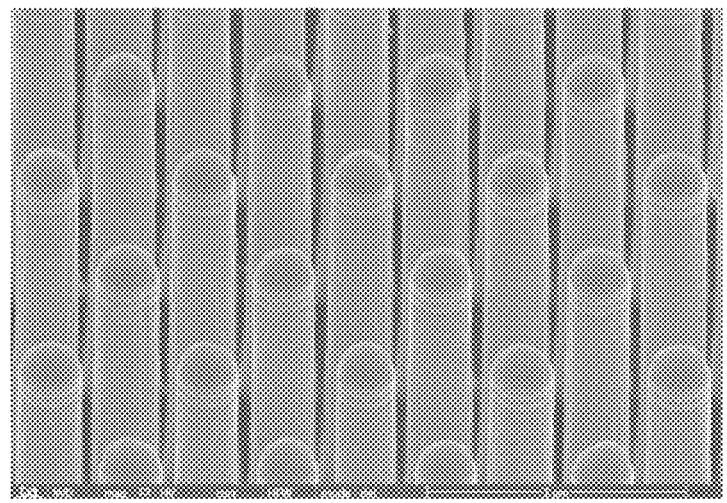
FIG. 3B is a picture showing a nanorod light emitting device manufactured by the method shown in FIGS. 1A to 1D.

For example, FIG. 3A is a picture showing a nanorod light emitting device manufactured by a method according to a comparative example, and FIG. 3B is a picture showing a nanorod light emitting device manufactured by the method shown in FIGS. 1A to 1D. Referring to FIGS. 3A and 3B, while the diameters of the nanorod light emitting devices manufactured according to the comparative example in which the inclination angle of the side surface to the base of the first hard mask 120 is greater than 80 degrees increases downward, it can be seen that the diameters of the nanorod light emitting devices manufactured according to the embodiment in which the inclination angle of the side surface to the base of the first hard mask 120 is about 80 degrees or less are maintained substantially constant.

In addition, when the inclination angle of the side surface to the base of the first hard mask 120 is about 80 degrees or less, the second semiconductor layer 105 under the first hard mask 120 may be prevented from being damaged and eroded by the etching gas.

Figure 4:
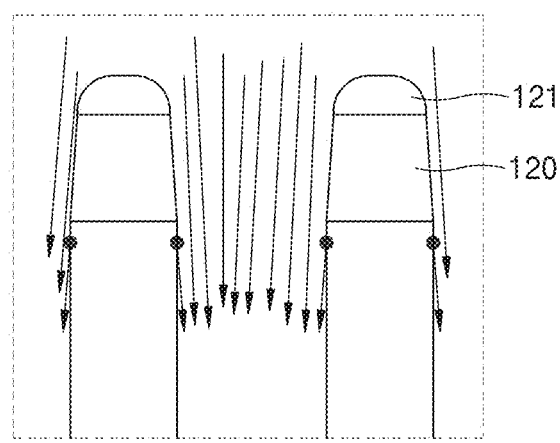
FIG. 4 is a conceptual diagram schematically showing the reason why the surface of the semiconductor layer under the first hard mask is damaged when the side inclination angle of the first hard mask is greater than 80 degrees.
Figure 5:
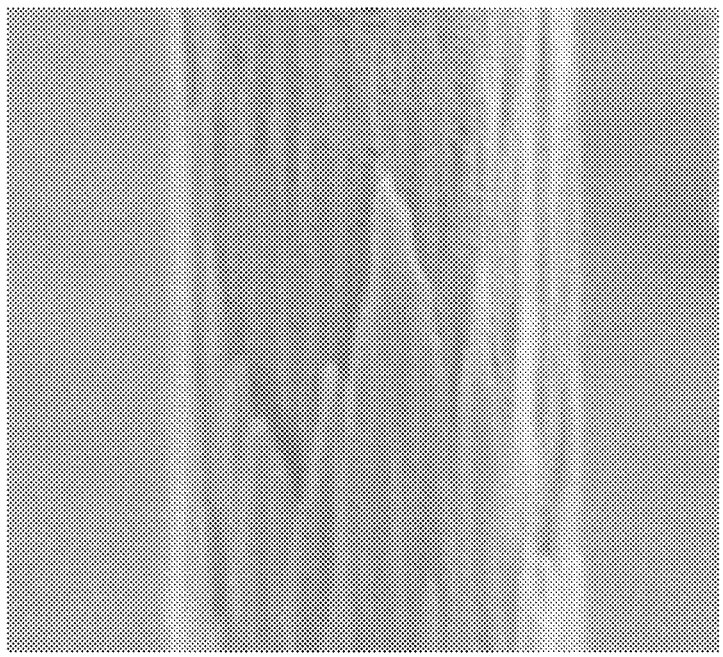
FIG. 5 is a picture showing a surface condition of a damaged semiconductor layer.

For example, FIG. 4 is a conceptual diagram that schematically illustrates the reason why the surface of the second semiconductor layer 105 under the first hard mask 120 is damaged when the side inclination angle of the first hard mask 120 is greater than 80 degrees, and FIG. 5 is a picture showing the surface condition of the second semiconductor layer 105, which is damaged. Referring to FIG. 4, when the side inclination angle of the first hard mask 120 is greater than 80 degrees, an etching gas flows in a substantially vertical direction along the surface of the first hard mask 120. The etching gas flowing in the vertical direction may directly impact the upper region of the second semiconductor layer 105 under the first hard mask 120. As a result, as the side surface of the upper region of the second semiconductor layer 105 is partially eroded, a ring-shaped groove may be formed in the upper region of the second semiconductor layer 105 as shown in the picture of FIG. 5. Referring to FIGS. 4 and 5, the contact layer 106 is omitted, and when the contact layer 106 is present between the first hard mask 120 and the second semiconductor layer 105, both the contact layer 106 and the second semiconductor layer 105 may be damaged.

Figure 6:
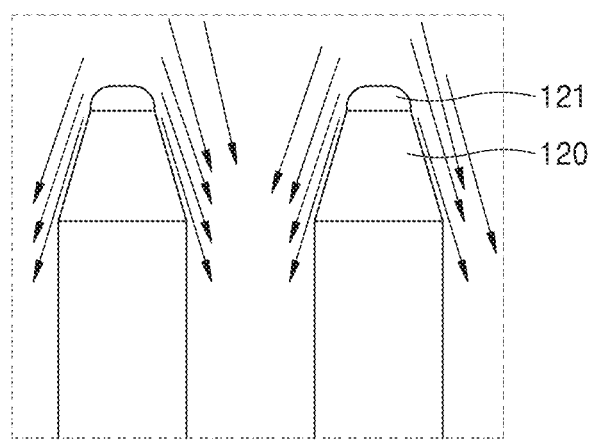
FIG. 6 is a conceptual diagram schematically showing the reason why the semiconductor layer under the first hard mask is not damaged when the side inclination angle of the first hard mask is about 80 degrees or less.
Figure 7:
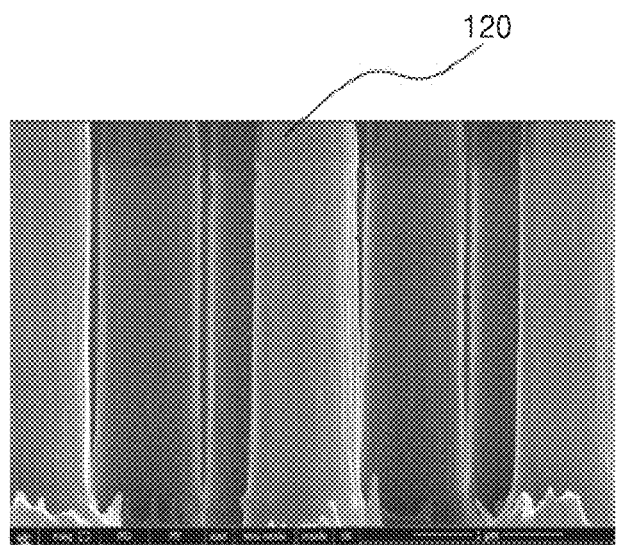
FIGS. 7 and 8 are pictures showing the surface state of an undamaged semiconductor layer.
Figure 8:
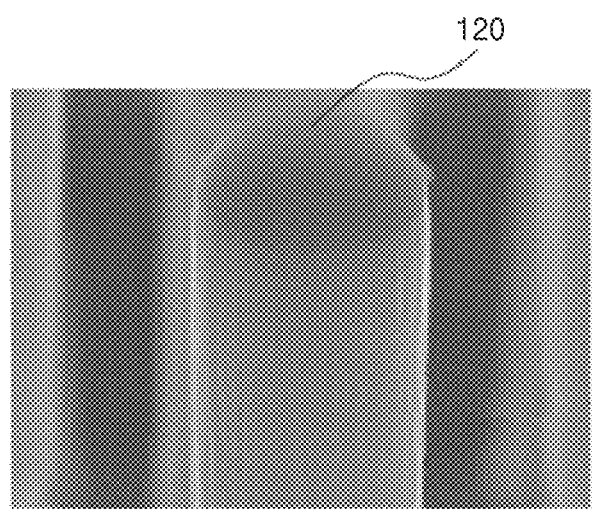

FIG. 6 is a conceptual diagram schematically showing the reason why damage does not occur in the second semiconductor layer 105 under the first hard mask 120 when the side inclination angle of the first hard mask 120 is about 80 degrees or less, and FIGS. 7 and 8 are pictures showing the surface condition of the second semiconductor layer 105 intact. Referring to FIG. 6, when the side inclination angle of the first hard mask 120 is about 80 degrees or less, the etching gas flows obliquely along the inclined side surface of the first hard mask 120. Accordingly, the second semiconductor layer 105 hardly receives a direct impact by the etching gas.

As a result, as shown in FIGS. 7 and 8, a ring-shaped groove may hardly be formed in the upper region of the second semiconductor layer 105 due to erosion by an etching gas. Also, even if a ring-shaped groove is formed, the depth of the ring-shaped groove may be relatively small. For example, even if the ring-shaped groove is formed on the side surface of the upper region of the second semiconductor layer 105, the diameter of the ring-shaped groove may be 90% or more of the diameter of the upper surface of the second semiconductor layer 105. In other words, the diameter of the ring-shaped groove formed in the side surface of the upper region of the second semiconductor layer 105 may be about 90% to about 100% of the diameter of the upper surface of the second semiconductor layer 105.

Figure 9:
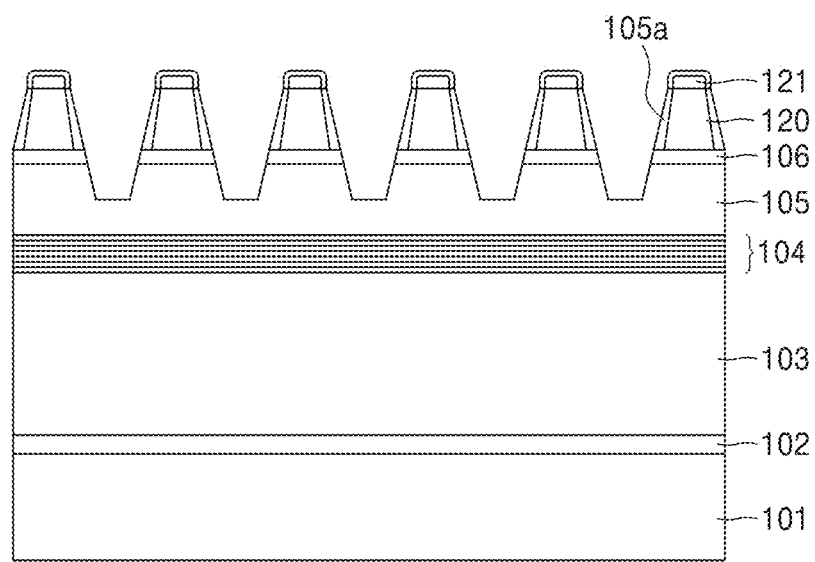
FIG. 9 is a schematic cross-sectional view illustrating a method of manufacturing a nanorod light emitting device, according to another embodiment.

FIG. 9 is a schematic cross-sectional view illustrating a method of manufacturing a nanorod light emitting device, according to another embodiment. The embodiment shown in FIG. 9 replaces the process shown in FIG. 1C among the methods of manufacturing the nanorod light emitting device shown in FIGS. 1A to 1D. In the process of forming the first hard mask 120 shown in FIG. 1C, when the upper surface of the contact layer 106 is exposed, the process of forming the first hard mask 120 is terminated. In the embodiment illustrated in FIG. 1C, in the absence of the contact layer 106, the etching process is terminated when the upper surface of the second semiconductor layer 105 is exposed. On the other hand, in the case of the embodiment shown in FIG. 9, even when the upper surface of the contact layer 106 or the second semiconductor layer 105 is exposed, over-etching may be performed by continuing the etching process for a predetermined time. For example, over-etching may be performed under the first hard mask 120 to a depth of ⅕ or more of the thickness of the first hard marks 120 to less than or equal to the thickness of the first hard marks 120. Accordingly, the contact layer 106 and the second semiconductor layer 105 between the adjacent first hard mask 120 are partially etched.

This over-etching process may be performed using Ar gas alone as an etching gas. For example, while maintaining the pressure in the chamber at about 5 mTorr to about 20 mTorr, Ar gas may be supplied to the chamber at a flow rate of about 5 sccm to about 20 sccm. At this time, about 250 W to about 400 W of power may be applied to the coil.

Then, as shown in FIG. 9, as the semiconductor material of the etched second semiconductor layer 105 is redeposited on the surface of the first hard mask 120, a coating layer 105a made of a semiconductor material may be formed on a surface of the first hard mask 120 including at least an inclined side surface. The coating layer 105a may make the surface state of the first hard mask 120 smooth. The coating layer 105a formed on the surface of the first hard mask 120 through over-etching may have a relatively smooth and regular surface, compared with the surface of the first hard mask 120 formed by the process illustrated in FIG. 1C.

The surface state of the first hard mask 120 may affect the surface quality of the nanorod light emitting device formed in the manufacturing process of the nanorod light emitting device illustrated in FIG. 1D. For example, when the surface condition of the first hard mask 120 is not good, a plurality of irregular stripe grooves may be formed in the surface of the manufactured nanorod light emitting device in the vertical direction. On the other hand, when the surface condition of the first hard mask 120 is good, these stripe grooves are less formed, and the depth of the stripe grooves may be reduced.

Figure 10:
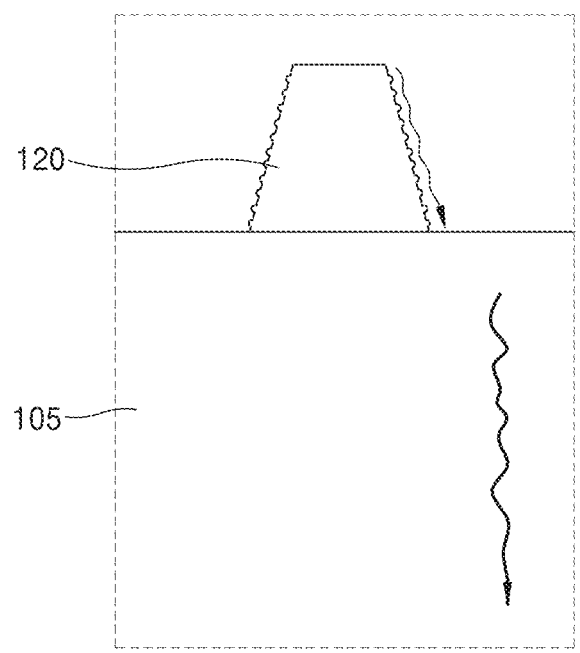
FIG. 10 is a conceptual diagram schematically showing the reason why stripe grooves are formed in the vertical direction in the surface of the nanorod light emitting device when there is no coating layer on the surface of the first hard mask.
Figure 11:
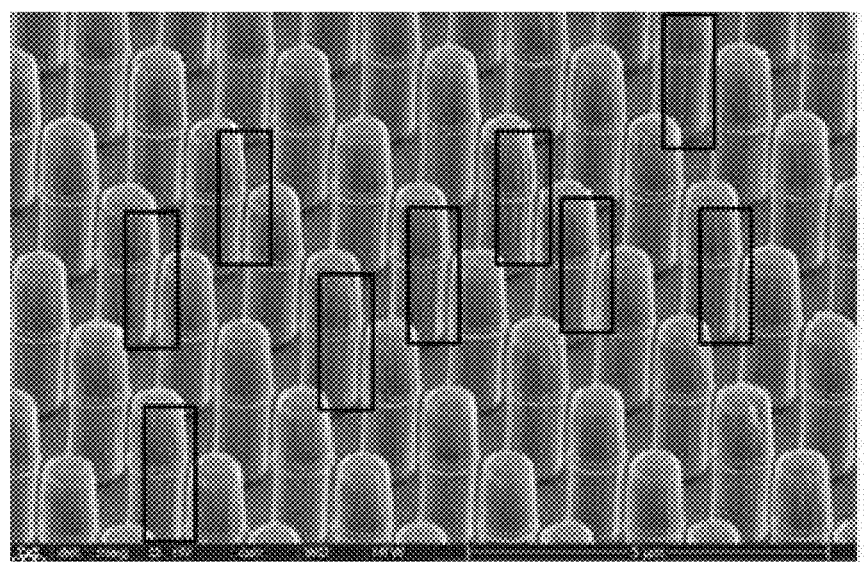
FIG. 11 is a picture showing a surface of a nanorod light emitting device in which stripe grooves are formed.
Figure 12:
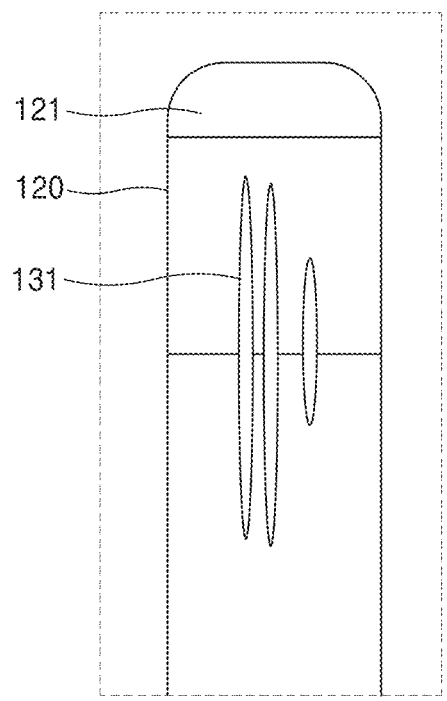
FIG. 12 is a conceptual diagram schematically showing stripe grooves.

FIG. 10 is a conceptual diagram schematically showing the reason why stripe grooves are formed in the vertical direction in the surface of the nanorod light emitting device when there is no coating layer 105a on the surface of the first hard mask 120, FIG. 11 is a picture showing a surface of a nanorod light emitting device in which stripe grooves are formed, and FIG. 12 is a conceptual diagram schematically showing stripe grooves. Referring to FIG. 10, when there is no coating layer 105a on the surface of the first hard mask 120, the first hard mask 120 has an irregular and rough surface. Accordingly, the etching gas also irregularly flows along the surface of the first hard mask 120. For example, while etching the contact layer 106, the second semiconductor layer 105, the light emitting layer 104, and the first semiconductor layer 103 under the first hard mask 120, the direction in which the etching gas flows, the flow rate of the etching gas may vary greatly for each area. Then, some areas on the surface of the nanorod light emitting device may be etched more or less than others. As a result, as shown in FIGS. 11 and 12, a plurality of stripe grooves 131 may be formed in the surface of the manufactured nanorod light emitting device in a vertical direction that extends from the second semiconductor layer 105 toward the first semiconductor layer 103. The plurality of stripe grooves 131 are irregularly formed, and may be formed differently for each of the plurality of nanorod light emitting devices.

Figure 13:
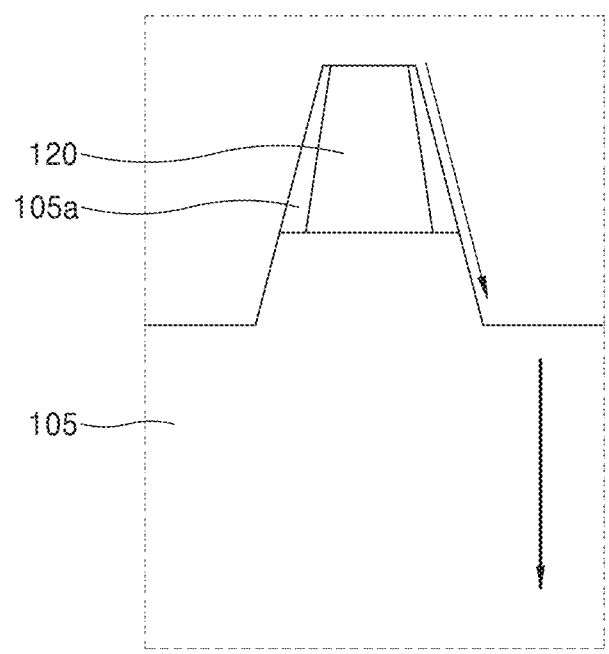
FIG. 13 is a conceptual diagram schematically showing why stripe grooves are hardly formed in the surface of a nanorod light emitting device in the manufacturing method according to the embodiment shown in FIG. 9.
Figure 14:
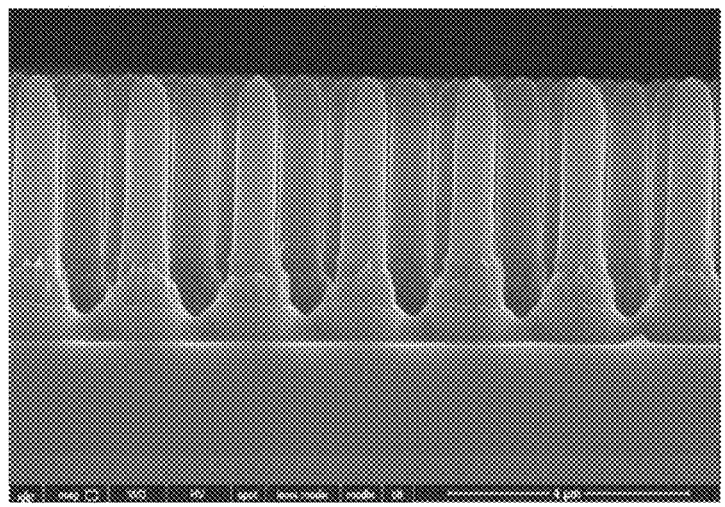
FIG. 14 is a picture showing a surface of a nanorod light emitting device formed by a manufacturing method according to an embodiment.

FIG. 13 is a conceptual diagram schematically showing why stripe grooves are hardly formed in the surface of a nanorod light emitting device in the manufacturing method according to the embodiment shown in FIG. 9, and FIG. 14 is a picture showing a surface of a nanorod light emitting device formed by a manufacturing method according to an embodiment. As shown in FIG. 13, when the coating layer 105a having a smooth surface is formed on the first hard mask 120, the etching process illustrated in FIG. 1D is hardly affected by the surface of the first hard mask 120. In addition, because the coating layer 105a formed on the first hard mask 120 has a relatively smooth and homogeneous surface, the etching gas may flow relatively uniformly along the surface of the coating layer 105a in the process shown in FIG. 1D. Accordingly, as shown in FIG. 14, a plurality of stripe grooves may be formed less or may not be formed on the surface of the manufactured nanorod light emitting device in the vertical direction.

Figure 15:
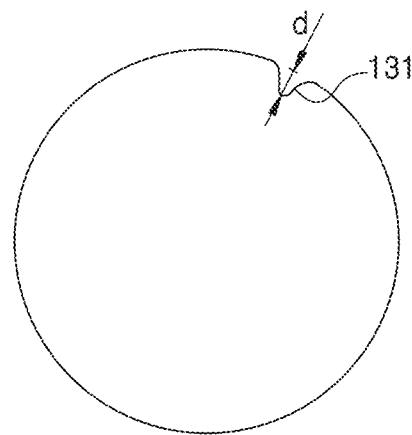
FIG. 15 is a cross-sectional view of a nanorod light emitting device for showing the depth of a stripe groove formed in a surface of the nanorod light emitting device.

In addition, according to the embodiment shown in FIG. 9, even if the stripe grooves are formed, the depth of the stripe grooves may be relatively small. FIG. 15 is a cross-sectional view of a nanorod light emitting device for showing the depth of a stripe groove formed in a side surface of the nanorod light emitting device. The depth d of the stripe groove 131 formed in the side surface of the nanorod light emitting device may be measured in a direction from the side surface of the nanorod light emitting device to an axis that connects the centers of the top base and the bottom base of the nanorod light emitting device. Referring to FIG. 15 that shows the circular cross-section of the nanorod light emitting device, the depth d of the stripe groove 131 formed in the side surface of the nanorod light emitting device may be defined as a diameter direction distance from the outer surface (i.e., the outer rim of the circular cross-section) of the nanorod light emitting device to the bottom of the stripe groove 131, in a direction from the outer surface to the center of the circular cross-section of the nanorod light emitting device. In the case of the nanorod light emitting device manufactured according to the embodiment illustrated in FIG. 9, the depth d of the stripe groove 131 may be, for example, about 10 nm or less.

Meanwhile, as described above, the nanorod light emitting device 100 may have a large aspect ratio. For example, the nanorod light emitting device 100 may have an aspect ratio of 5 or more. In general, the outer diameter of the nanorod light emitting device 100 may be selected to be about 600 nm and the height H of the nanorod light emitting device 100 may be selected to be about 5 μm, and in this case, the aspect ratio of the nanorod light emitting device 100 is slightly greater than 8.

However, when the nanorod light emitting device 100 having a large aspect ratio with such a small size is manufactured, the surface to volume ratio increases, and the surface defect of the light emitting layer 104 increases. In other words, surface defects due to dangling bonds occur on the outer surface of the light emitting layer 104, and as the surface to volume ratio increases, the dangling bonds also increase, resulting in an increase in surface defects. These surface defects interfere with the flow of current and become a factor of lowering the luminous efficiency of the light emitting layer 104.

Figure 16:
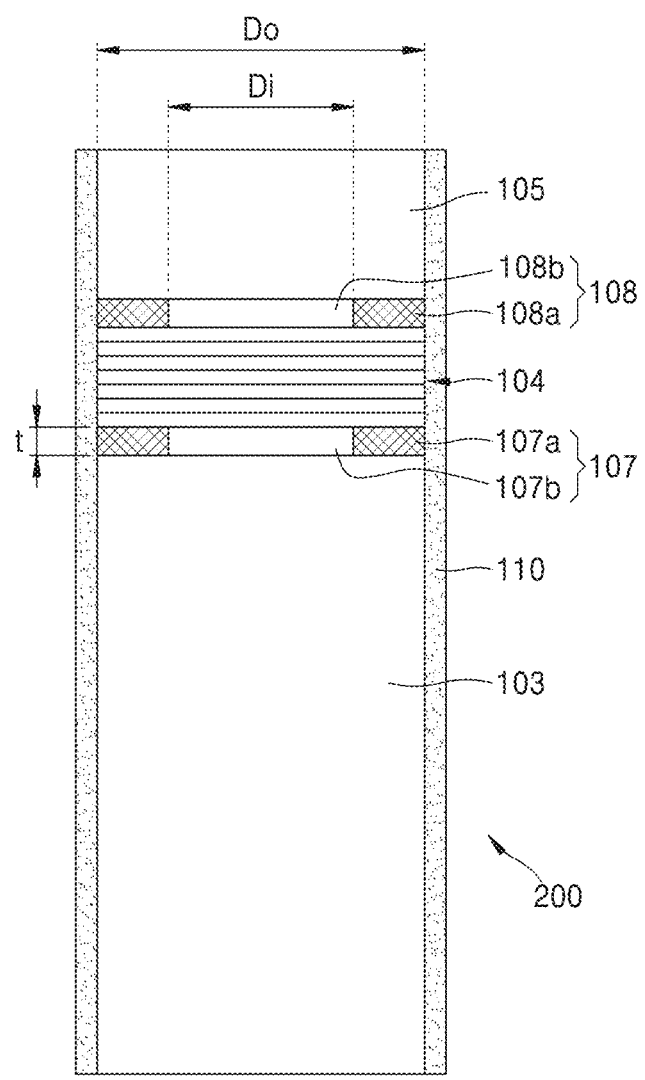
FIG. 16 is a cross-sectional view showing a schematic structure of a nanorod light emitting device according to another embodiment.

FIG. 16 is a cross-sectional view showing a schematic structure of a nanorod light emitting device according to another embodiment. Referring to FIG. 16, a nanorod light emitting device 200 may further include a first current passage layer 107 disposed between the first semiconductor layer 103 and the light emitting layer 104, a second current passage layer 108 disposed between the light emitting layer 104 and the second semiconductor layer 105, and a passivation layer 110 surrounding a side surface of the stack constituting the nanorod light emitting device 200. The rest of the configuration of the nanorod light emitting device 200 is the same as that of the nanorod light emitting device 100 illustrated in FIG. 2, and thus, a detailed description thereof will be omitted.

The first current passage layer 107 and the second current passage layer 108 disposed on the lower and upper surfaces of the light emitting layer 104, respectively, improve the luminous efficiency of the light emitting layer 104 by concentrating the current to the center of the light emitting layer 104 with almost no surface defect. For this, the first current passage layer 107 may include a first current blocking layer 107a disposed between the edge of the lower surface of the light emitting layer 104 and the edge of the upper surface of the first semiconductor layer 103, and a first conductor layer 107b disposed between the central portion of the lower surface of the light emitting layer 104 and the central portion of the upper surface of the first semiconductor layer 103. The first current blocking layer 107a has a ring shape surrounding a sidewall of the first conductor layer 107b in the same layer as the first conductor layer 107b. In addition, the second current passage layer 108 may include a second current blocking layer 108a disposed between the edge of the upper surface of the light emitting layer 104 and the edge of the lower surface of the second semiconductor layer 105, and a second conductor layer 108b disposed between the central portion of the upper surface of the light emitting layer 104 and the central portion of the lower surface of the second semiconductor layer 105. The second current blocking layer 108a has a ring shape surrounding the sidewall of the second conductor layer 108b in the same layer as the second conductor layer 108b.

The thickness t of the first current blocking layer 107a may be the same as the thickness of the first conductor layer 107b, and the thickness of the second current blocking layer 108a may be substantially the same as the thickness of the second conductor layer 108b. For example, the thickness t of the first current blocking layer 107a and the second current blocking layer 108a may range from about 5 nm to about 200 nm.

The outer diameters of the first current blocking layer 107a and the second current blocking layer 108a may range from about 0.3 μm to about 1 μm, which is substantially the same as the outer diameter Do of the nanorod light emitting device 200. Accordingly, the diameter of the first semiconductor layer 103, the diameter of the first current blocking layer 107a, the diameter of the light emitting layer 104, the diameter of the second current blocking layer 108a, and the diameters of the second semiconductor layer 105 may be substantially the same as each other. The diameter Di of the first conductor layer 107b and the second conductor layer 108b may be about 0.05 μm or more and may be less than the outer diameters of the first current blocking layer 107a and the second current blocking layer 108a.

In this structure, the first current blocking layer 107a and the second current blocking layer 108a prevent current from flowing near the surface of the light emitting layer 104 having surface defects, and most or all current is supplied only to the central portion of the light emitting layer 104 having almost no surface defects through the first conductor layer 107b and the second conductor layer 108b. Accordingly, the nanorod light emitting device 200 may achieve high luminous efficiency while having a small size and a large aspect ratio.

FIG. 16 illustrates that the first current passage layer 107 and the second current passage layer 108 are disposed on both the lower and upper surfaces of the light emitting layer 104, but are not limited thereto. For example, the nanorod light emitting device 200 may include only one of the first current passage layer 107 disposed on the lower surface of the light emitting layer 104 and the second current passage layer 108 disposed on the upper surface of the light emitting layer 104.

The passivation layer 110 may be formed by crystal-growing a material having a crystal structure similar to that of the light emitting layer 104. In this case, the passivation layer 110 may have an epitaxial relationship with the light emitting layer 104. In other words, a hetero junction is formed at the interface between the passivation layer 110 and the light emitting layer 104. Then, because the dangling bond on the outer surface of the light emitting layer 104 is removed, surface defects occurring on the outer surface of the light emitting layer 104 may disappear. Accordingly, surface defects of the light emitting layer 104 may be recovered, and accordingly, the luminous efficiency of the nanorod light emitting device 200 may be further improved.

FIGS. 17A to 17E are cross-sectional views schematically illustrating a method of manufacturing the nanorod light emitting device 200, shown in FIG. 16. Hereinafter, a method of manufacturing the nanorod light emitting device 200 will be described with reference to FIGS. 17A to 17E.

Figure 17A:
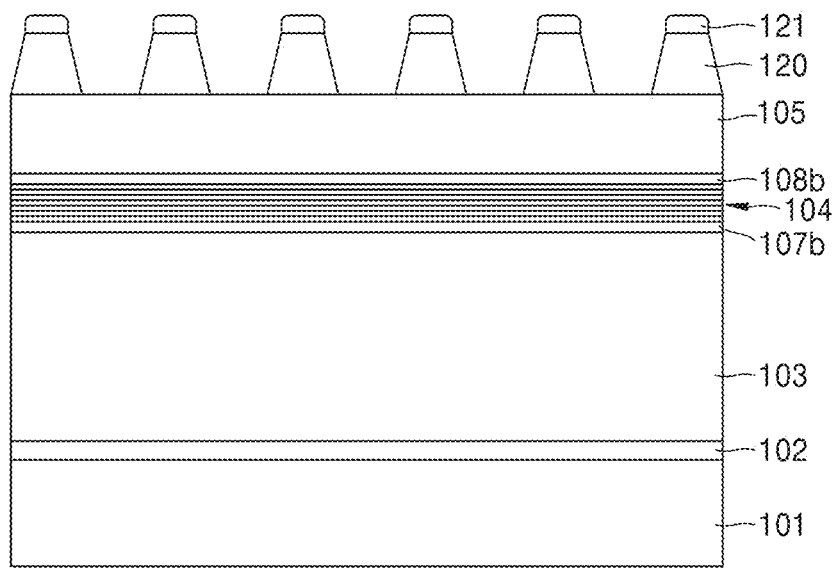
FIGS. 17A to 17E are cross-sectional views schematically illustrating a method of manufacturing the nanorod light emitting device shown in FIG. 16.

Referring to FIG. 17A, a sacrificial layer 102, a first semiconductor layer 103, a first conductor layer 107b, a light emitting layer 104, a second conductor layer 108b, and a second semiconductor layer 105 are sequentially grown on the substrate 101. Further, a contact layer 106 may be further formed on the upper surface of the second semiconductor layer 105.

The substrate 101 and the sacrificial layer 102 may be, for example, n-GaAs. When the nanorod light emitting device 200 is a light emitting device that generates red light, the first semiconductor layer 103 may be formed of, for example, n-AlGaInP, and the second semiconductor layer 105 may be formed of p-AlGaInP. Therefore, the first semiconductor layer 103 is a single layer made of a semiconductor material of a single composition, the second semiconductor layer 105 is also a single layer made of a semiconductor material having the same composition as that of the first semiconductor layer 103, and the first semiconductor layer 103 and the second semiconductor layer 105 are doped in opposite types. For example, the first semiconductor layer 103 may be doped with Si and the second semiconductor layer 105 may be doped with Zn. In addition, when the contact layer 106 is further formed, the contact layer 106 may be formed of, for example, p-GaInP or p-GaAs, or may include both p-GaInP and p-GaAs.

The light emitting layer 104 may be formed of, for example, AlGaInP when generating red light. AlGaInP of the light emitting layer 104 is not doped. The light emitting layer 104 includes a barrier and a quantum well, and for this, the content of Al in AlGaInP may vary. For example, the barrier includes more Al in AlGaInP than in quantum wells. In addition, when compared with the light emitting layer 104, the first and second semiconductor layers 103 and 105 have the highest Al content, and next, there is a large amount of Al in the barrier in the light emitting layer 104, and the content of Al is the lowest in the quantum well in the light emitting layer 104. Then, the energy levels of the first and second semiconductor layers 103 and 105 are the highest in the conduction band, the energy level of the barrier in the light emitting layer 104 is next highest, and the energy level of the quantum well in the light emitting layer 104 is the lowest.

After forming the second semiconductor layer 105, as shown in FIGS. 1A to 1C, after forming the first hard mask layer 120', the second hard mask layer 121', and the soft mask 123, the second hard mask 121 may be formed by patterning the second hard mask layer 121', and the first hard mask 120 may be formed by patterning the first hard mask layer 120'. Then, the first hard mask 120 may have a side surface having an inclination angle of about 80 degrees or less. In addition, when patterning the first hard mask layer 120', as illustrated in FIG. 9, over-etching may be performed.

Figure 17B:
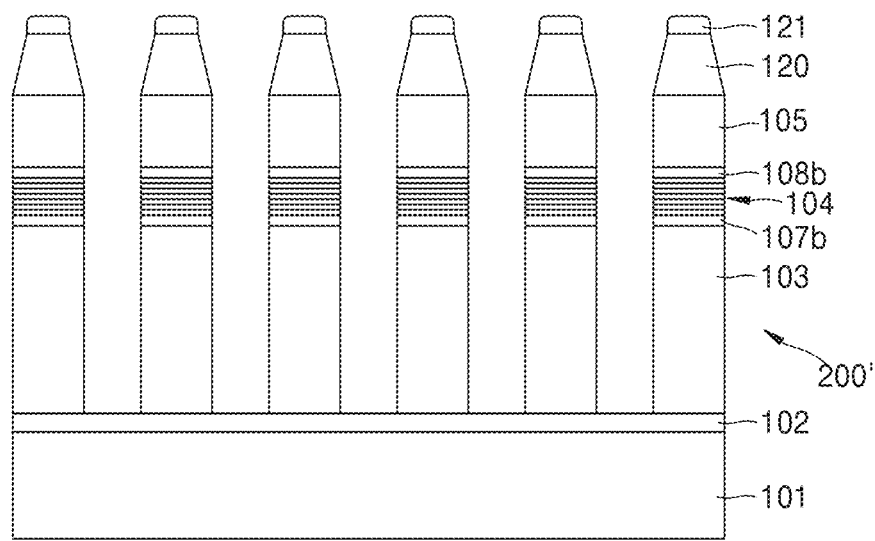

After forming the first hard mask 120 having a side surface inclined at an inclination angle of about 80 degrees or less, as shown in FIG. 17B, regions not covered by the first hard mask 120 may be removed by dry etching. For example, the second semiconductor layer 105, the second conductor layer 108b, the light emitting layer 104, the first conductor layer 107b, and the first semiconductor exposed between the first hard masks 120 may be removed by sequentially etching them so that the sacrificial layer 102 is exposed. Then, a plurality of nanorods 200' each including the first semiconductor layer 103, the first conductor layer 107b, the light emitting layer 104, the second conductor layer 108b, and the second semiconductor layer 105 may be formed on the substrate 101 and the sacrificial layer 102.

Figure 17C:
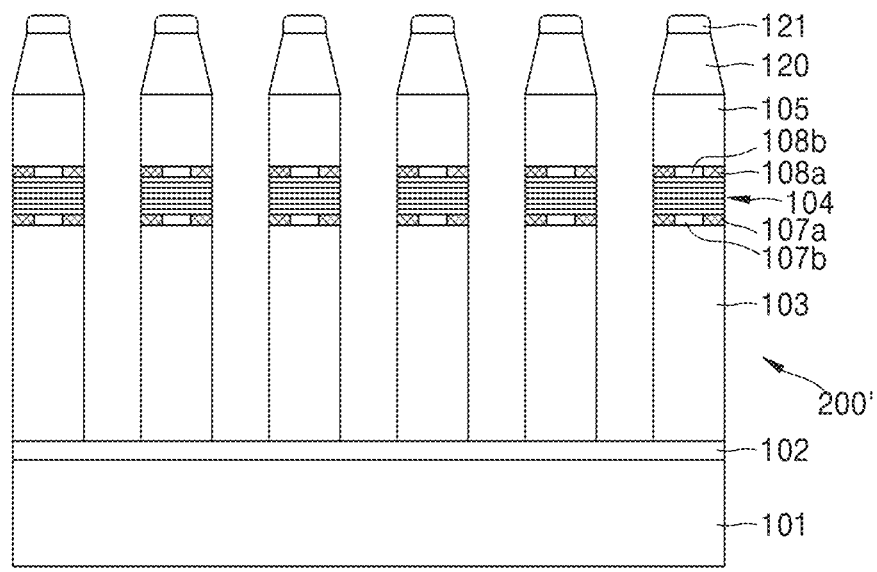

Next, referring to FIG. 17C, as the sidewalls of the first conductor layer 107b and the second conductor layer 108b are oxidized, a first current blocking layer 107a surrounding the sidewall of the first conductor layer 107b and a second current blocking layer 108a surrounding the sidewall of the second conductor layer 108b may be formed. For this, the first conductor layer 107b and the second conductor layer 108b may be made of a semiconductor material that has a similar crystal structure to the first and second semiconductor layers 103 and 105 and the light emitting layer 104 and is susceptible to oxidation. For example, the first conductor layer 107b and the second conductor layer 108b may be made of a material including $Al_xGa_{1-x}As$ and are not doped. When $Al_xGa_{1-x}As$ is used as the first conductor layer 107b and the second conductor layer 108b, as the content of aluminum (Al) increases, the light output of the nanorod light emitting device 200 increases, and oxidation of $Al_xGa_{1-x}As$ is easier. Further, as the thickness of the first conductor layer 107b and the second conductor layer 108b decreases, the oxidation rate is slower. Accordingly, the thickness of the first conductor layer 107*b* and the second conductor layer 108*b* and the x value of AlxGa1-xAs may be appropriately adjusted. For example, the thickness of the first conductor layer 107*b* and the second conductor layer 108*b* may range from about 5 nm to about 200 nm, and x may be selected as x≥0.85.

The oxidation process of the first conductor layer 107*b* and the second conductor layer 108*b* may be performed by increasing the temperature to about 400° C. or higher while flowing deionized (DI) water in an oxygen 02 atmosphere. Then, as Al in AlxGa1-xAs is oxidized from the outermost sidewalls of the first conductor layer 107*b* and the second conductor layer 108*b*, a first current blocking layer 107*a* and a second current blocking layer 108*a* are formed. Accordingly, the first current blocking layer 107*a* and the second current blocking layer 108*a* may include an oxide material formed by oxidizing side surfaces of the first conductor layer 107*b* and the second conductor layer 108*b*. For example, the first current blocking layer 107*a* and the second current blocking layer 108*a* may include AlOx, which is a chemical compound of aluminum and oxygen. The first current blocking layer 107*a* and the second current blocking layer 108*a* may also partially include components such as Al, Ga, and As remaining without oxidation. Because AlOx has high electrical resistance, the first current blocking layer 107*a* and the second current blocking layer 108*a* may prevent current from flowing to the outer sidewall of the light emitting layer 104.

Figure 17D:
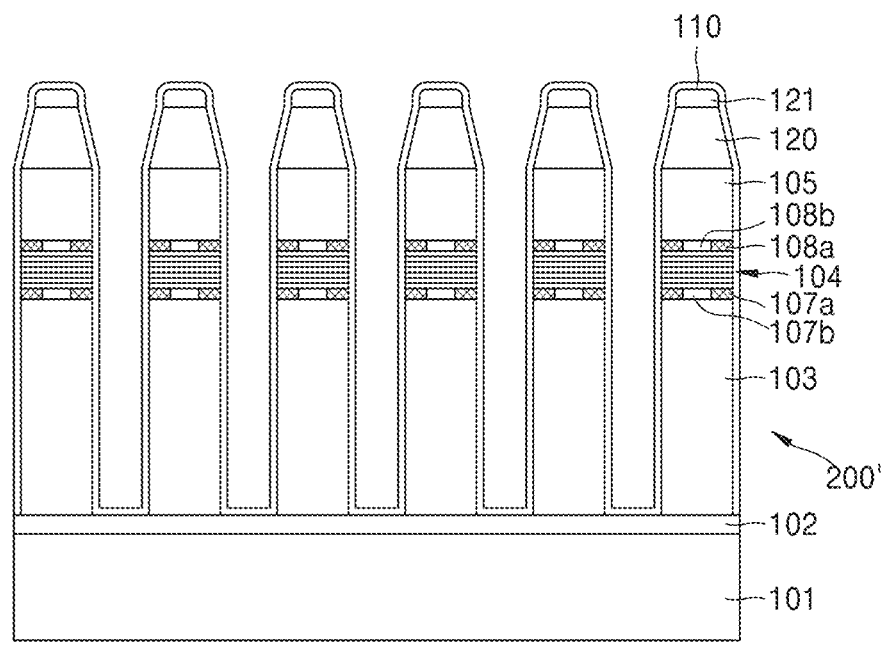

Referring to FIG. 17D, a passivation layer 110 is formed with a predetermined thickness along the surfaces of the plurality of nanorods 200' and the sacrificial layer 102. Then, the sidewalls of the first semiconductor layer 103, the first current blocking layer 107*a*, the light emitting layer 104, the second current blocking layer 108*a*, and the second semiconductor layer 105 of each of the nanorods 200' are surrounded by the passivation layer 110. The passivation layer 110 may be formed using, for example, metal-organic chemical vapor deposition (MOCVD) or atomic layer deposition (ALD).

The passivation layer 110 may be made of a material having a high electrical resistance and a large band gap, for example, AlOx, HfOx, TiOx, SiNx, and SiOx. Also, the passivation layer 110 may be formed of a material capable of automatic oxidation. For example, the passivation layer 110 may include $Al_xGa_{1-x}As$ (x≥0.9). $Al_xGa_{1-x}As$ tends to be oxidized as the content of x in $Al_xGa_{1-x}As$ increases. Therefore, by selecting x to be greater than about 0.9, the passivation layer 110 may be formed by naturally oxidizing $Al_xGa_{1-x}As$ without a special treatment process. In this case, after oxidation of $Al_xGa_{1-x}As$, the passivation layer 110 mainly includes an AlOx component. In particular, in the case of forming the passivation layer 110 by crystal-growing a material having a crystal structure similar to that of the light emitting layer 104, the passivation layer 110 may have an epitaxial relationship with the light emitting layer 104. For example, the passivation layer 110 formed by growing $AlO_x$, $HfO_x$, $Ti_{Ox}$, and $Al_xGa_{1-x}As$ (x≥0.9) by MOCVD or ALD may have an epitaxial relationship with the light emitting layer 104.

Figure 17E:
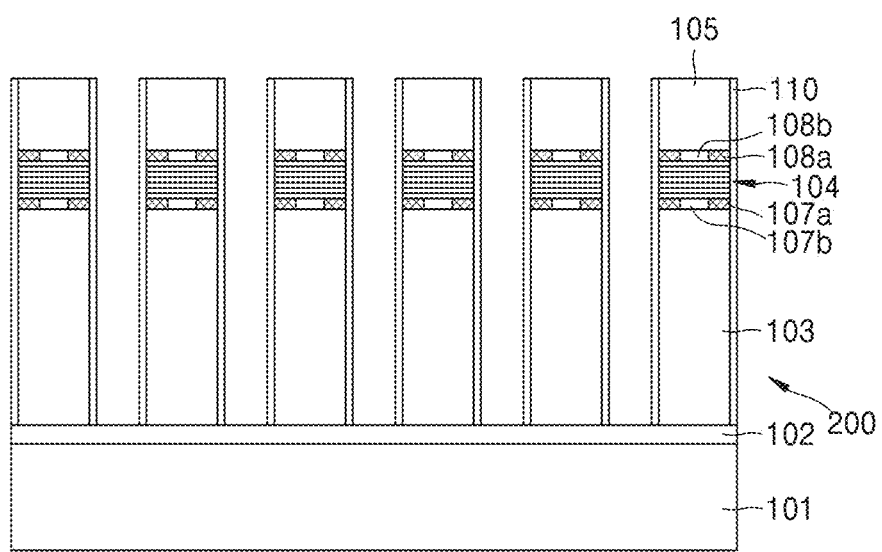

Finally, referring to FIG. 17E, the material of the passivation layer 110 remaining on the sacrificial layer 102 and the first and second hard masks 120 and 121 remaining on the second semiconductor layer 105 or the contact layer 106 may be removed. Then, a plurality of nanorod light emitting devices 200 may be formed on the substrate 101 and the sacrificial layer 102 at once.

Figure 18:
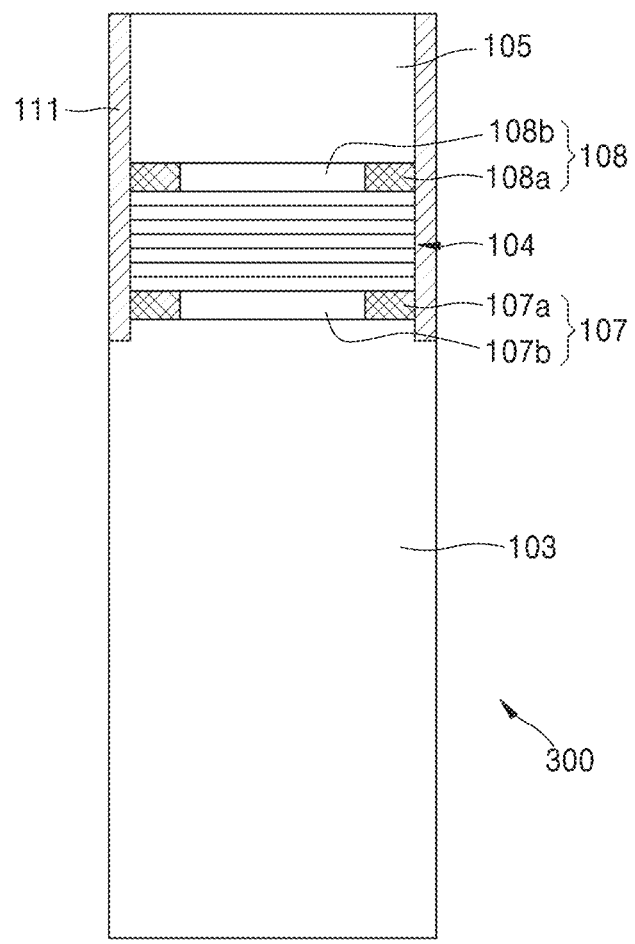
FIG. 18 is a cross-sectional view showing a schematic structure of a nanorod light emitting device according to another embodiment.

FIG. 18 is a cross-sectional view showing a schematic structure of a nanorod light emitting device according to another embodiment. Referring to FIG. 18, a nanorod light emitting device 300 may further include an insulating film 111 for preventing current from flowing to the side surface of the light emitting layer 104. The rest of the configuration of the nanorod light emitting device 300 may be the same as the nanorod light emitting device 100 shown in FIG. 2 or the nanorod light emitting device 200 shown in FIG. 16. For example, in the nanorod light emitting device 300 illustrated in FIG. 18, the first and second current passage layers 107 and 108 may be omitted. In addition, although the passivation layer 110 is not shown in FIG. 18, the nanorod light emitting device 300 may further include a passivation layer 110.

As described above, surface defects may occur on the edge surface of the light emitting layer 104. When the current is spread along the edge of the light emitting layer 104, where the surface defect has occurred, the luminous efficiency may decrease. In order to prevent spreading of current that may occur along the edge of the light emitting layer 104, the insulating film 111 may be disposed to surround side surfaces of the second semiconductor layer 105, the second current blocking layer 108*a*, the light emitting layer 104, and the first current blocking layer 107*a*. Accordingly, the insulating film 111 may have a ring shape surrounding the side surfaces of the second semiconductor layer 105, the second current blocking layer 108*a*, the light emitting layer 104, and the first current blocking layer 107*a*. In addition, the insulating film 111 may extend to the first semiconductor layer 103. In this case, the insulating film 111 may have a ring shape surrounding the sides of the second semiconductor layer 105, the second current blocking layer 108*a*, the light emitting layer 104, the first current blocking layer 107*a*, and the first semiconductor layer 103. However, the insulating film 111 may be disposed to surround only the entire side surface of the light emitting layer 104 at least.

The insulating film 111 may include one or more heavy ions implanted using an ion implantation process. For example, the insulating film 111 may include one or more elements from Ar, As, Kr, and Xe. General ions implanted using the ion implantation process may be excessively diffused along the width direction perpendicular to the height direction by a collision cascade. However, when heavy ions are implanted, a phenomenon in which the insulating film 111 is disorderly extended along the width direction may be prevented. Through this, the luminous efficiency may be improved by preventing the insulating film 111 from excessively reducing the light emitting area of the light emitting layer 104.

The outer diameter of the insulating film 111 formed by the ion implantation process may be the same as the outer diameter of the nanorod light emitting device 300. In this case, the outer diameters of the first current blocking layer 107*a* and the second current blocking layer 108*a* may be less than the outer diameters of the nanorod light emitting device 300.

Figure 19:
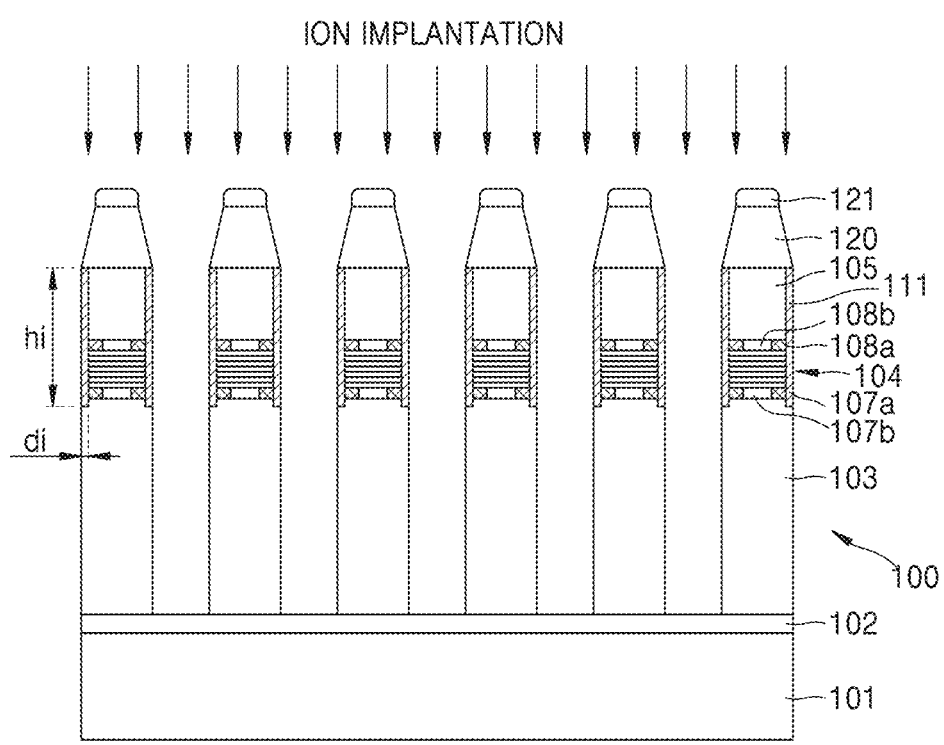
FIG. 19 is a schematic cross-sectional view illustrating a method of manufacturing the nanorod light emitting device shown in FIG. 18.

FIG. 19 is a schematic cross-sectional view illustrating a method of manufacturing the nanorod light emitting device 300 shown in FIG. 18. The process shown in FIG. 19 may be performed between the process shown in FIG. 17C and the process shown in FIG. 17D described above. For example, after etching the second semiconductor layer 105, the second conductor layer 108*b*, the light emitting layer 104, the first conductor layer 107*b*, and the first semiconductor layer 103 exposed between the first hard masks 120 so that the sacrificial layer 102 is exposed, the process shown in FIG. 19 may be performed. Thereafter, the processes shown in FIGS. 17D to 17E may be performed again.

Referring to FIG. 19, heavy ions are implanted into the side surfaces of the second semiconductor layer 105, the second conductor layer 108b, the light emitting layer 104, and the first conductor layer 107b by an ion implantation method so that an insulating film 111 may be formed. The ion implantation method is a process of directly implanting ions into the side surfaces of the second semiconductor layer 105, the second conductor layer 108b, the light emitting layer 104, and the first conductor layer 107b to ensure certain electrical properties, for example, insulating properties. In this case, the depth and width of the ion implantation may be determined according to the type of ion, the ion implantation tilting angle, acceleration energy, and the number of implanted ions per unit area (dose).

The width di in the horizontal direction in which the insulating film 111 extends may be controlled to be small so as not to excessively reduce the light emitting area of the light emitting layer 104. For this, when a collision cascade occurs during the ion implantation process, the ion implantation conditions may be controlled to control the width at which ions are implanted. In particular, when the ions in the insulating film 111 are heavy ions, the width of the ion implantation may be prevented from being extended randomly. In addition, according to the selected height hi and width di of the insulating film 111, the depth and width of the ion implantation may control the type of ions, the ion implantation tilt angle, the acceleration energy, and the number of implanted ions per unit area.

Figure 20:
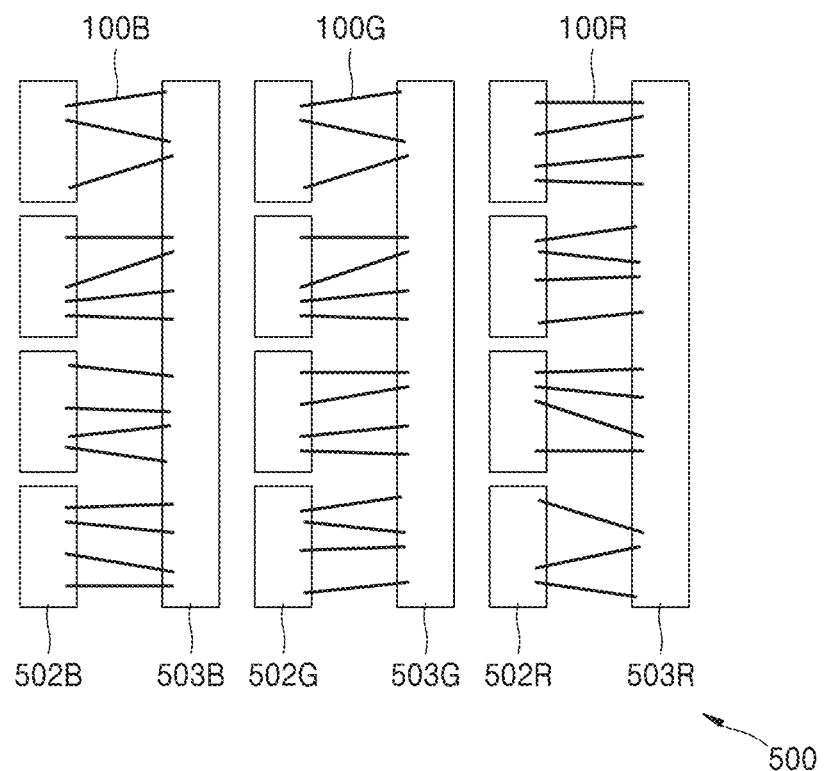
FIG. 20 is a conceptual diagram schematically showing a configuration of a display apparatus according to an embodiment using a nanorod light emitting device.

The nanorod light emitting device according to the above-described embodiments may be applied in various ways. In particular, the nanorod light emitting device may be used as a light emitting element of pixels of a next-generation display apparatus. For example, FIG. 20 is a conceptual diagram schematically showing a configuration of a display apparatus according to an embodiment using a nanorod light emitting device. Referring to FIG. 20, a display apparatus 500 may include a plurality of first pixel electrodes 502B, a first common electrode 503B corresponding to the plurality of first pixel electrodes 502B, a plurality of second pixel electrodes 502G, a second common electrode 503G corresponding to the plurality of second pixel electrodes 502G, a plurality of third pixel electrodes 502R, a third common electrode 503R corresponding to the plurality of third pixel electrodes 502B, a plurality of first nanorod light emitting devices 100B connected between each of the first pixel electrodes 502B and the first common electrode 503B, a plurality of second nanorod light emitting devices 100G connected between each second pixel electrode 502G and the second common electrode 503G, and a plurality of third nanorod light emitting devices 100R connected between each third pixel electrode 502R and the third common electrode 503R.

For example, the first nanorod light emitting device 100B may be configured to emit blue light, the second nanorod light emitting device 100G may be configured to emit green light, and the third nanorod light emitting device 100R may be configured to emit red light. In addition, one first pixel electrode 502B may constitute one blue sub-pixel together with the first common electrode 503B, one second pixel electrode 502G may constitute one green sub-pixel together with the second common electrode 503G, and one third pixel electrode 502R may constitute one red sub-pixel together with the third common electrode 503R.

Figure 21A:
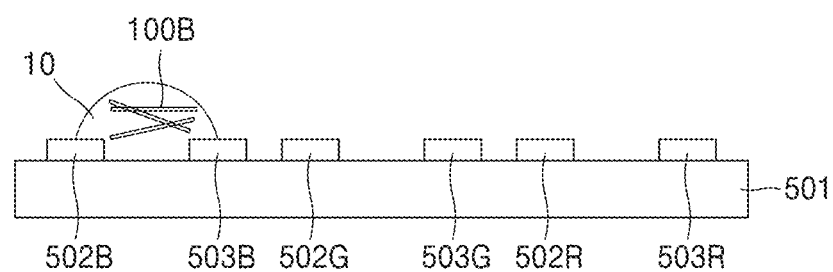
FIGS. 21A to 21C show a process of disposing a plurality of first nanorod light emitting devices between the first pixel electrode and the first common electrode to manufacture the display apparatus shown in FIG. 21 as an example.
Figure 21B:
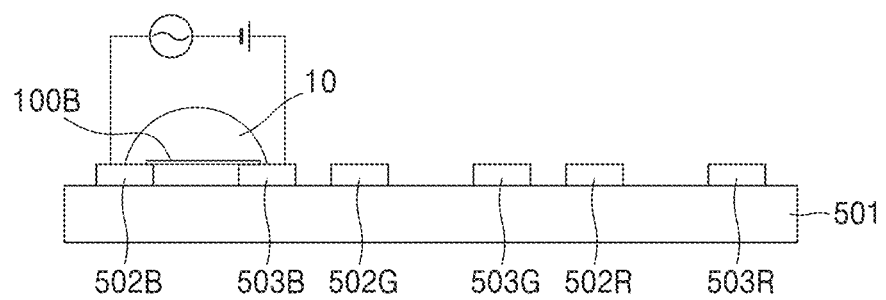
Figure 21C:
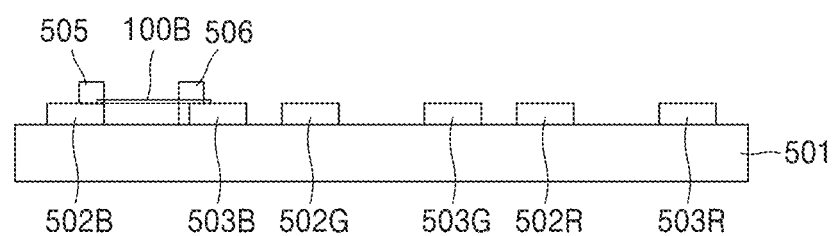

FIGS. 21A to 21C show a process of disposing a plurality of first nanorod light emitting devices 100B between the first pixel electrode 502B and the first common electrode 503B to manufacture the display apparatus 500 shown in FIG. 20 as an example.

First, referring to FIG. 21A, a first pixel electrode 502B, a first common electrode 503B, a second pixel electrode 502G, a second common electrode 503G, a third pixel electrode 502R, and a third common electrode 503R are formed on the substrate 501. A driving circuit connected to the first pixel electrode 502B, the first common electrode 503B, the second pixel electrode 502G, the second common electrode 503G, the third pixel electrode 502R, and the third common electrode 503R may be further disposed on the substrate 501 or inside the substrate 501 to control the lighting operation of the first to third nanorod light emitting devices 100B, 100G, and 100R. Then, a solution 10 including the plurality of first nanorod light emitting devices 100B may be dispersed in a region between the first pixel electrode 502B and the first common electrode 503B. The dispersion of the solution 10 may be performed using an inkjet printing method, but is not limited thereto.

Further, referring to FIG. 21B, an electric field is applied between the first pixel electrode 502B and the first common electrode 503B. Then, the plurality of first nanorod light emitting devices 100B may be self-aligned between the first pixel electrode 502B and the first common electrode 503B by the electric field. Here, the order of dispersion of the solution 10 and the application of an electric field may be interchanged. For example, in a state in which an electric field is applied between the first pixel electrode 502B and the first common electrode 503B, the solution 10 including the plurality of first nanorod light emitting devices 100B may be dispersed in a region between the first pixel electrode 502B and the first common electrode 503B.

Particularly, the nanorod light emitting devices according to the present embodiments may be easily self-aligned because they have a uniform diameter in the height direction. When the diameters of both ends of the nanorod light emitting device are significantly different, for example, when the cross-section of the nanorod light emitting device has a trapezoidal shape, since the roll distance between both ends of the nanorod light emitting device is different when the nanorod light emitting device rolls, the nanorod light emitting device does not move in a straight line. On the other hand, the nanorod light emitting devices according to the present embodiments have a substantially uniform diameter in the height direction, and thus may roll in a straight line. Therefore, it is easy to move the nanorod light emitting devices according to the embodiments to a desired position.

When the plurality of first nanorod light emitting devices 100B are self-aligned, as shown in FIG. 21C, a first contact electrode 505 for electrically and/or physically stably connecting the first nanorod light emitting device 100B may be formed on the first pixel electrode 502B, and a second contact electrode 506 for electrically and/or physically stably connecting the first nanorod light emitting device 100B may also be formed on the first common electrode 503B.

The process shown in FIGS. 21A to 21C may be identically applied to a process of disposing the second nanorod light emitting device 100G between the second pixel electrode 502G and the second common electrode 503G, and a process of disposing the third nanorod light emitting device 100R between the third pixel electrode 502R and the third common electrode 503R.

Figure 22:
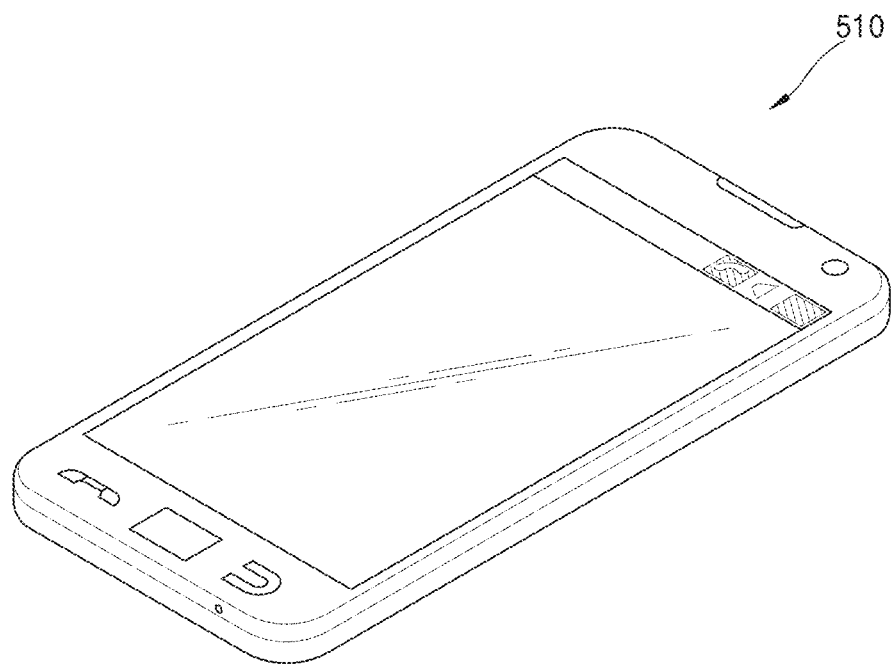
FIGS. 22 to 28 show examples of various display apparatuses to which nanorod light emitting devices according to the embodiment are applied.
Figure 23:
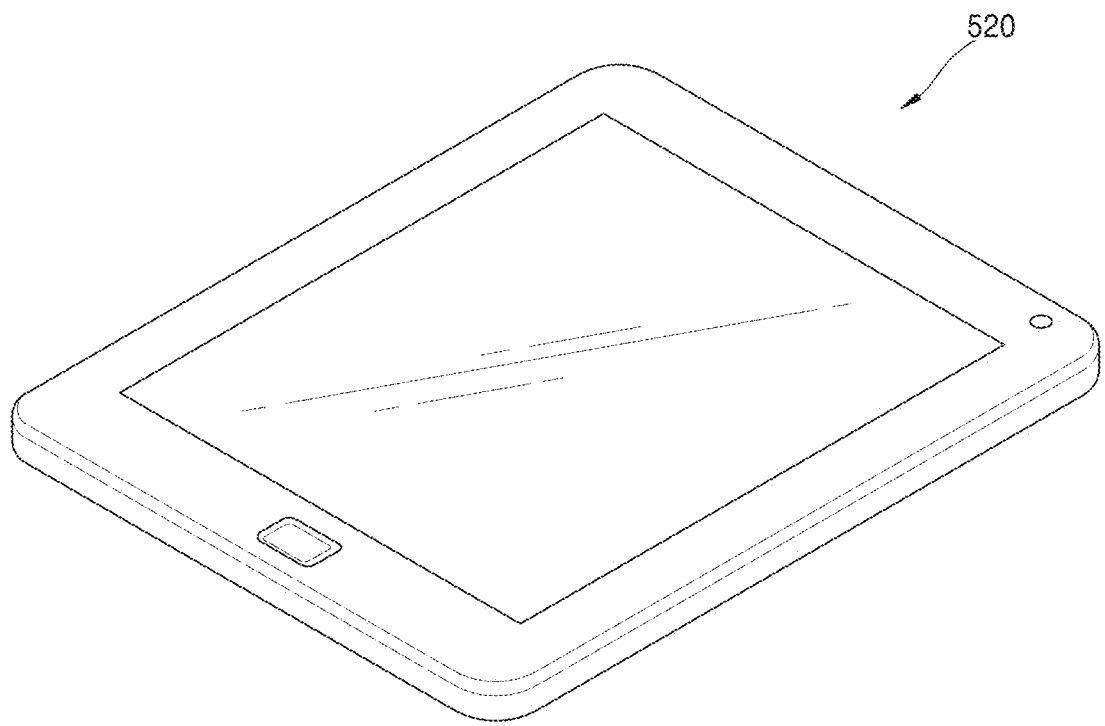
Figure 24:
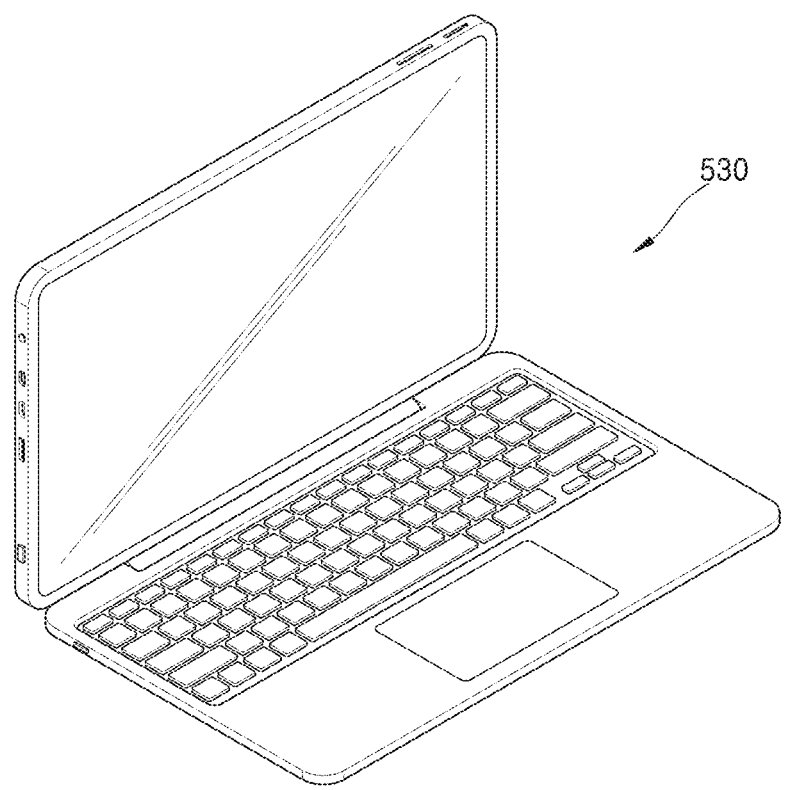
Figure 25:
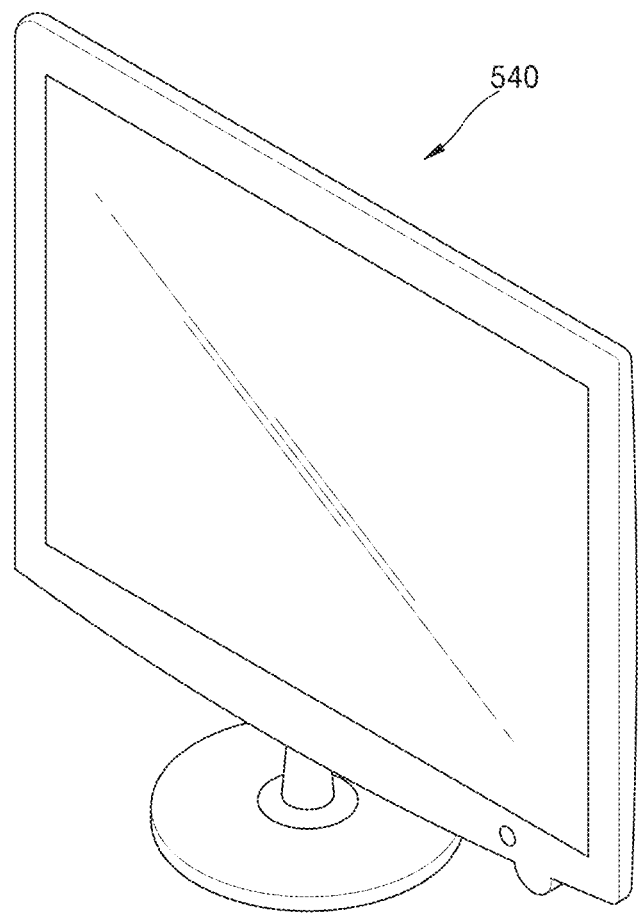
Figure 26:
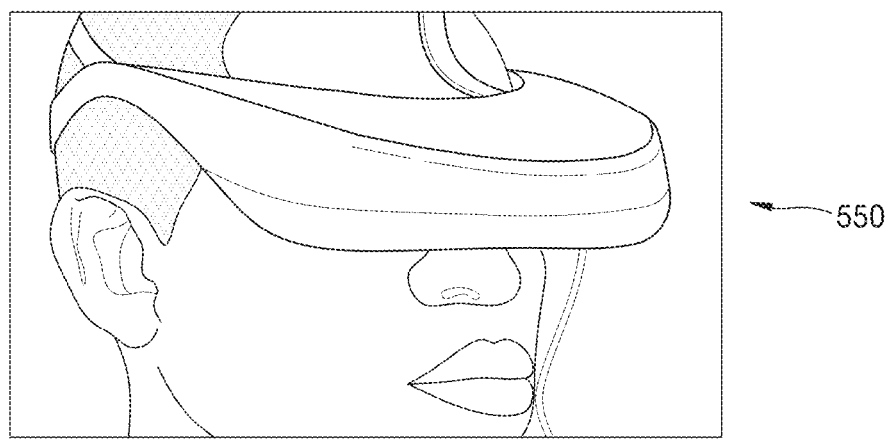
Figure 27:
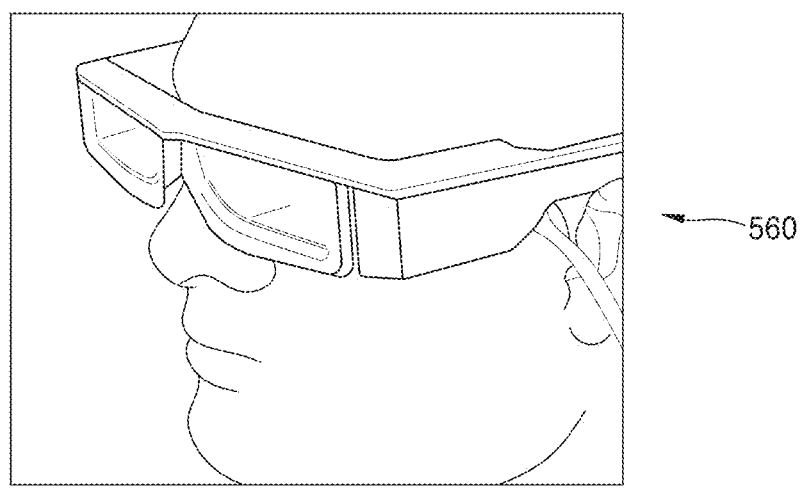
Figure 28:
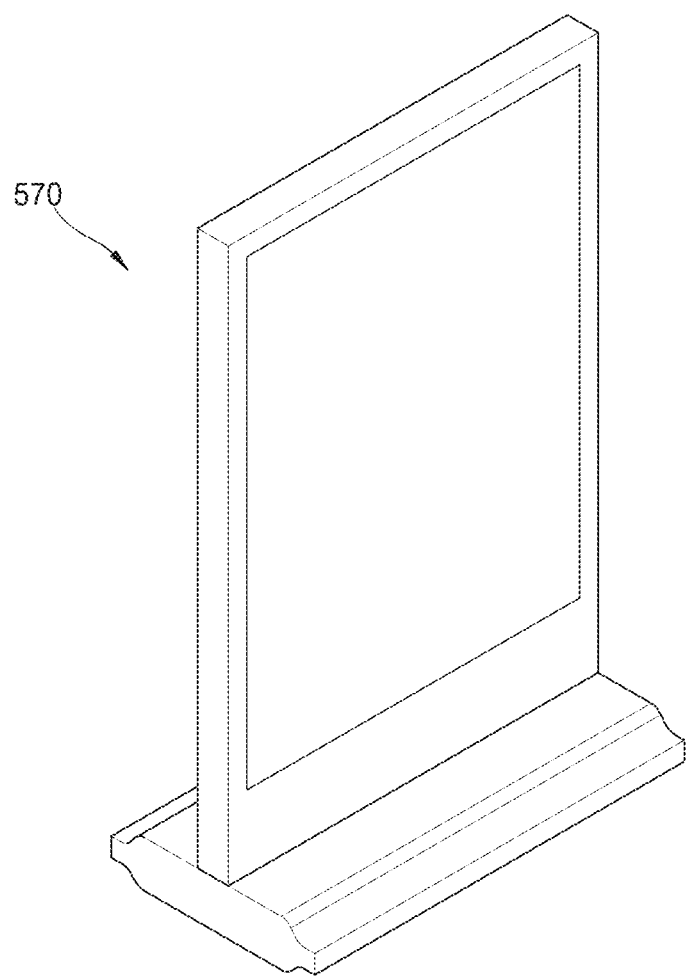

The nanorod light emitting device according to the above-described embodiments may be applied to display apparatuses of various sizes and uses without limitation. For example, FIGS. 22 to 28 show examples of various display apparatuses to which nanorod light emitting devices according to the embodiment are applied. As shown in FIG. 22, the nanorod light emitting device may be applied to a display panel of a mobile phone or a smart phone 510, and may be applied to a display panel of a tablet or a smart tablet 520 as shown in FIG. 23. In addition, the nanorod light emitting device according to the embodiments may be applied to the display panel of a notebook computer 530 as shown in FIG. 24, and may be applied to the display panel of a television or smart television 540 as shown in FIG. 25. In addition, as shown in FIGS. 26 and 27, the nanorod light emitting device may be applied to a small display panel used in a head mounted display (HMD) 550, a glasses-type display, or a goggle-type display 560. In addition, the nanorod light emitting device may be applied to a large display panel used in a signage 570, a large electronic signboard, and a theater screen as illustrated in FIG. 28.

Although the above-described nanorod light emitting device, manufacturing method thereof, and display apparatus including the nanorod light emitting device have been described with reference to the embodiment shown in the drawings, the foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A nanorod light emitting device comprising:
   a first semiconductor layer doped with a first conductivity type, and comprising a first lower surface and a first upper surface that oppose each other;
   a second semiconductor layer doped with a second conductivity type that is electrically opposite to the first conductivity type, and comprising a second lower surface and a second upper surface that oppose each other;
   a light emitting layer disposed between the first upper surface of the first semiconductor layer and the second lower surface of the second semiconductor layer; and
   a groove formed in a side surface of the second semiconductor layer,
   wherein a distance between the first lower surface of the first semiconductor layer and the second upper surface of the second semiconductor layer is in a range of 2 μm to 10 μm,
   wherein a difference between a second diameter of the second upper surface of the second semiconductor layer and a first diameter of the first lower surface of the first semiconductor layer is 10% or less of the second diameter of the second upper surface of the second semiconductor layer, and
   wherein a third diameter of the groove of the second semiconductor layer is 90% to 95% of the second diameter of the second upper surface of the second semiconductor layer, and
   wherein the diameter of the first lower surface of the first semiconductor layer and the diameter of the second upper surface of the second semiconductor layer is from 0.3 μm to 0.5 μm.

2. The nanorod light emitting device of claim 1, wherein the groove has a ring shape.

3. The nanorod light emitting device of claim 1, wherein the groove has a stripe shape and extends in a direction from the second semiconductor layer toward the first semiconductor layer, wherein a depth of the groove from the side surface of the nanorod light emitting device to a bottom of the stripe groove is 10 nm or less.

4. The nanorod light emitting device of claim 1, further comprising:
   a first current passage layer comprising:
      a first conductor layer disposed between a central portion of a lower surface of the light emitting layer and the first semiconductor layer; and
      a first current blocking layer disposed to surround a sidewall of the first conductor layer;
   a second current passage layer comprising:
      a second conductor layer disposed between a central portion of an upper surface of the light emitting layer and the second semiconductor layer; and
      a second current blocking layer disposed to surround a sidewall of the second conductor layer,
   wherein the lower surface and the upper surface of the light emitting layer are directly in contact with the first current passage layer and the second current passage layer, respectively.

5. The nanorod light emitting device of claim 4, wherein the current blocking layer comprises an oxide material formed by oxidizing a side surface of the conductor layer.

6. The nanorod light emitting device of claim 4,
   wherein an outer diameter of each of the first current blocking layer and the second current blocking layer is in a range of 0.3 μm to 0.5 μm,
   wherein a diameter of the first conductor layer and the second conductor layer is 0.05 μm or more is less than the outer diameter of each of the first current blocking layer and the second current blocking layer.

7. The nanorod light emitting device of claim 4, wherein a thickness of the first current blocking layer is equal to a thickness of the first conductor layer.

8. The nanorod light emitting device of claim 7, wherein the thickness of the first current blocking layer is in a range of 5 nm to 200 nm.

9. The nanorod light emitting device of claim 4, wherein the first conductor layer comprises $Al_xGa_{1-x}As$, the first current blocking layer comprises a chemical compound of aluminum and oxide, and the first and the second semiconductor layers comprise AlGaInP, and
   wherein x is greater than 0.85.

10. The nanorod light emitting device of claim 4, further comprising a passivation layer disposed to surround side surfaces of the first semiconductor layer, the first current blocking layer, the second current blocking layer, the light emitting layer, and the second semiconductor layer.

11. The nanorod light emitting device of claim 10, wherein the passivation layer comprises at least one material selected from a chemical compound of hydrogen fluoride and oxide, a chemical compound of aluminum and oxide, a chemical compound of silicon and nitrogen, a chemical compound of silicon and oxide, and $Al_xGa_{1-x}As$, and wherein x is greater than 0.9.

12. The nanorod light emitting device of claim 4,
   further comprising an insulating film disposed to surround side surfaces of the second semiconductor layer, the light emitting layer, the first current blocking layer, and the second current blocking layer and including implanted heavy ions,
   wherein the heavy ions comprise one or more of As, Kr, and Xe.

13. A display apparatus comprising:
   a plurality of pixel electrodes;
   a common electrode corresponding to the plurality of pixel electrodes; and a plurality of nanorod light emitting devices connected between each of the plurality of pixel electrodes and the common electrode, wherein each of the plurality of nanorod light emitting devices comprises:
- a first semiconductor layer doped with a first conductivity type, and comprising a first lower surface and a first upper surface that oppose each other;
- a second semiconductor layer doped with a second conductivity type that is electrically opposite to the first conductivity type, and comprising a second lower surface and a second upper surface that oppose each other; and
- a light emitting layer disposed between the first upper surface of the first semiconductor layer and the second lower surface of the second semiconductor layer; and
- a groove formed in a side surface of the second semiconductor layer, wherein a distance between the first lower surface of the first semiconductor layer and the first upper surface of the second semiconductor layer is in a range of 2 μm to 10 μm, wherein a difference between a second diameter of the second upper surface of the second semiconductor layer and a first diameter of the first lower surface of the first semiconductor layer is 10% or less of the second diameter of the second upper surface of the second semiconductor layer, wherein a third diameter of the groove of the second semiconductor layer is 90% to 95% of the second diameter of the second upper surface of the second semiconductor layer, and wherein the diameter of the first lower surface of the first semiconductive layer and the diameter of the second upper surface of the second semiconductor layer is from 0.3 μm to 0.5 μm.

* * * * *